United States Patent
Li et al.

(10) Patent No.: US 7,998,640 B2
(45) Date of Patent: Aug. 16, 2011

(54) MASK REUSE IN SEMICONDUCTOR PROCESSING

(75) Inventors: Calvin K. Li, Fremont, CA (US);
Yung-Tin Chen, Santa Clara, CA (US);
En-Hsing Chen, Fremont, CA (US);
Paul Wai Kie Poon, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 644 days.

(21) Appl. No.: 11/772,137

(22) Filed: Jun. 30, 2007

(65) Prior Publication Data

US 2009/0004880 A1 Jan. 1, 2009

(51) Int. Cl.
*G03F 1/00* (2006.01)
*G03C 5/00* (2006.01)

(52) U.S. Cl. .......................................... 430/5; 430/394

(58) Field of Classification Search ................ 430/5, 22, 430/30, 311, 312, 313, 394; 257/797; 438/761, 438/622, 692, 740
See application file for complete search history.

(56) References Cited

U.S. PATENT DOCUMENTS

| | | | |
|---|---|---|---|
| 5,308,682 A | 5/1994 | Morikawa | |
| 5,892,291 A | 4/1999 | Narimatsu et al. | |
| 5,936,311 A | 8/1999 | Watrobski et al. | |
| 5,960,296 A | 9/1999 | Auzino et al. | |
| 6,071,656 A | 6/2000 | Lin | |
| 6,238,939 B1 | 5/2001 | Wachs et al. | |
| 6,362,491 B1 | 3/2002 | Wang et al. | |
| 6,589,713 B1 | 7/2003 | Okoroanyanwu | |
| 6,617,669 B2 | 9/2003 | Saito | |
| 6,627,530 B2 | 9/2003 | Li et al. | |
| 6,819,426 B2 | 11/2004 | Sezginer et al. | |
| 6,949,462 B1 | 9/2005 | Yang et al. | |
| 7,071,565 B2 | 7/2006 | Li et al. | |
| 7,234,244 B2 | 6/2007 | Lindberg | |
| 7,553,611 B2 * | 6/2009 | Chen et al. | 430/394 |
| 2004/0207097 A1 | 10/2004 | Carpi et al. | |
| 2004/0259322 A1 | 12/2004 | Lu et al. | |
| 2006/0222962 A1 | 10/2006 | Chen et al. | |

FOREIGN PATENT DOCUMENTS

| | | |
|---|---|---|
| JP | 2229419 A | 9/1990 |
| KR | 10-1998-0016943 A | 6/1998 |
| WO | WO 2006/105326 A1 | 10/2006 |

OTHER PUBLICATIONS

International Search Report for Application # PCT/US2008/068273 Dated Jan. 28, 2009.
Non Final Office Action for U.S. Appl. No. 11/772,130, Dated Mar. 24, 2009.
Non-Final Office Action from U.S. Appl. No. 11/772,128 dated April 28, 2009.
Non-Final Office Action for related U.S. Appl. No. 11/772,128 dated Feb. 23, 2010.
Notice of Allowance for U.S. Appl. No. 11/772,130 dated Jan. 11, 2010.
Final Office Action for U.S. Appl. No. 11/772,130 dated Oct. 20, 2009.

(Continued)

*Primary Examiner* — Stephen Rosasco
(74) *Attorney, Agent, or Firm* — Cooper Legal Group LLC

(57) ABSTRACT

A mask is reused to form the same pattern in multiple layers in semiconductor processing. Reference marks that allow alignment accuracy to be checked are also formed with the mask. The manner of using the mask advantageously mitigates interference between reference marks in different layers.

18 Claims, 21 Drawing Sheets

OTHER PUBLICATIONS

Notice of Allowance cited in related U.S. Appl. No. 11/772,128 dated Jul. 13, 2010.
Notice of Allowance cited in related U.S. Appl. No. 11/772,130 dated Jun. 28, 2010.
Final Office Action cited in related U.S. Appl. No. 11/772,128 dated Oct. 8, 2009.
Restriction/Election cited in related U.S. Appl. No. 11/772,130 dated Nov. 28, 2008.
Notice of Allowance cited in related U.S. Appl. No. 11/772,130 dated Sep. 15, 2010.
First Office Action in Related Chinese Application No. 200880022858.0 dated Jan. 19, 2011.

* cited by examiner

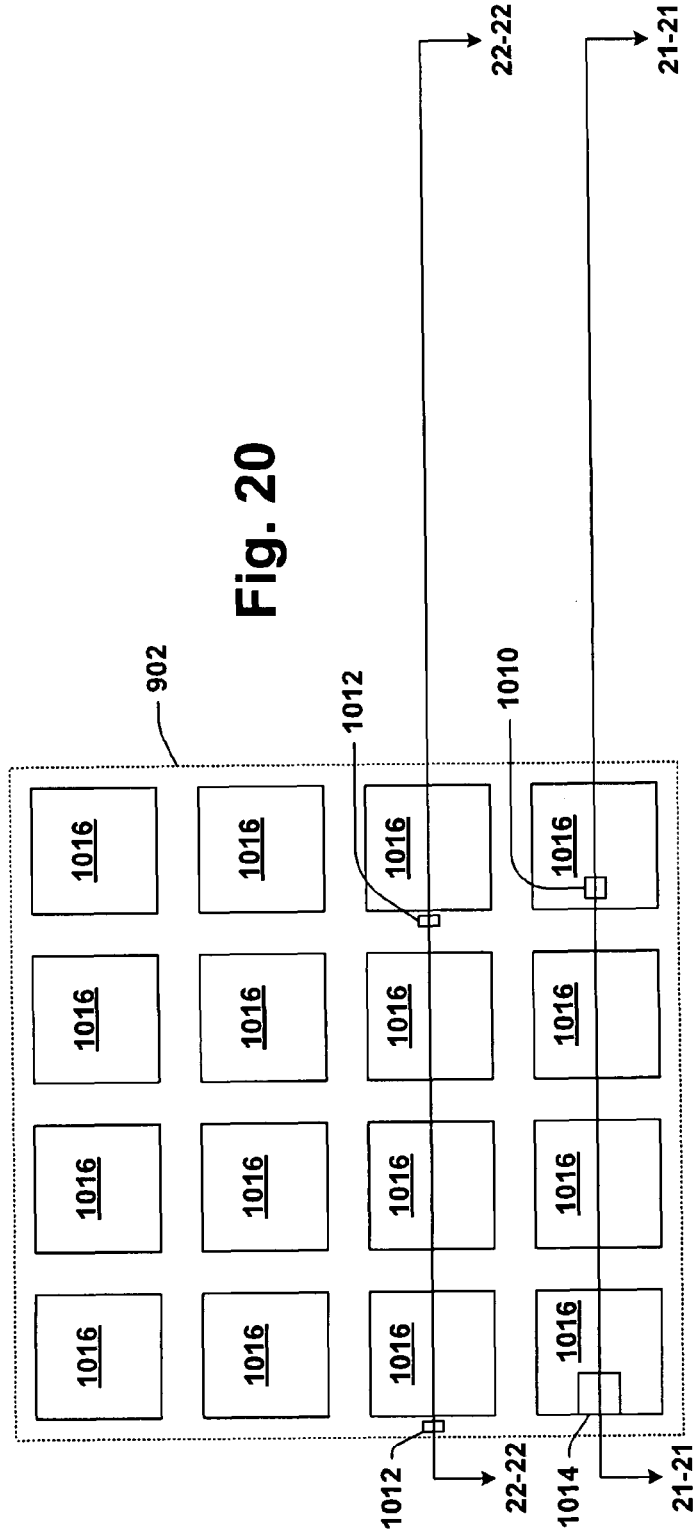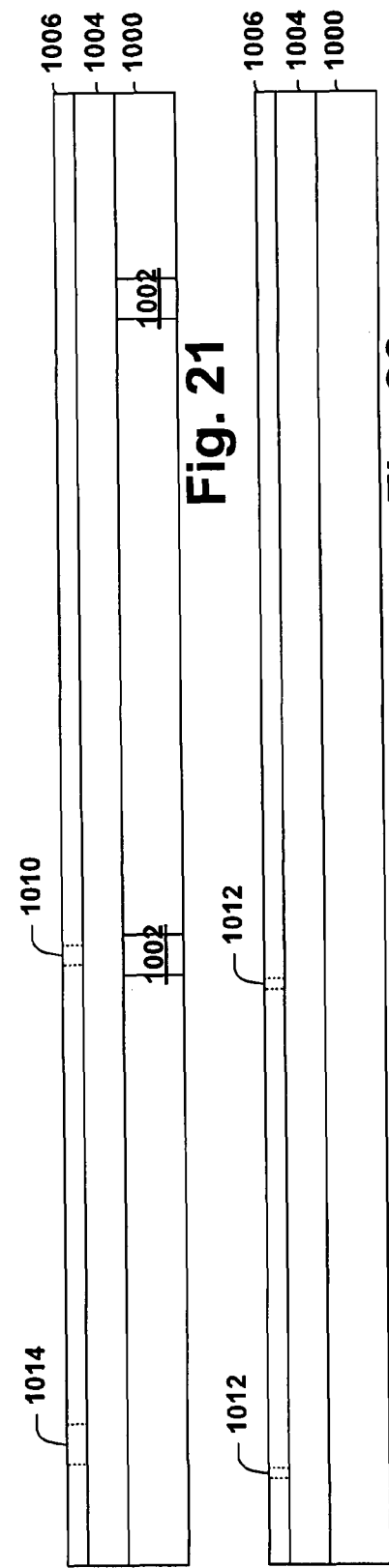

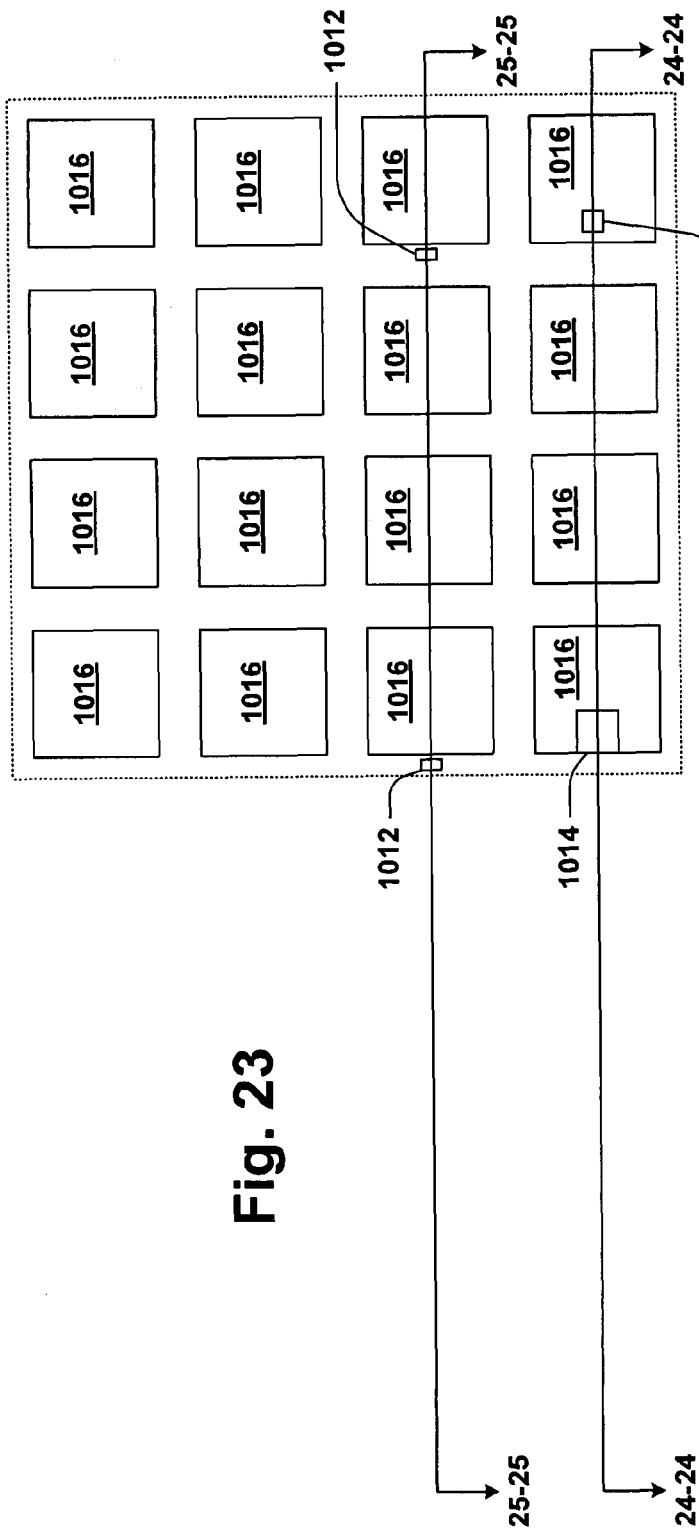
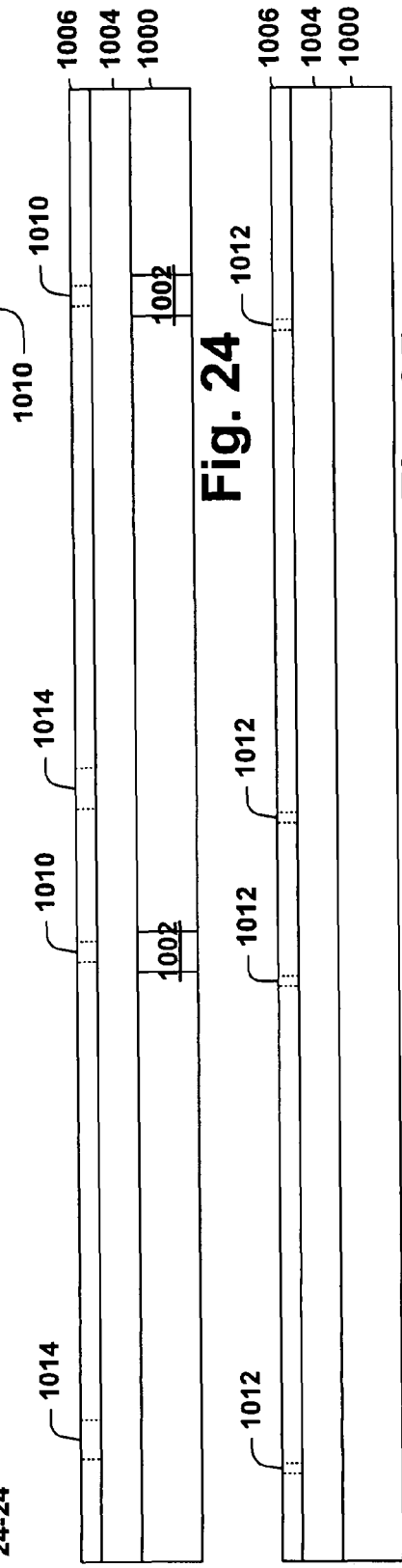
Fig. 23
Fig. 24
Fig. 25

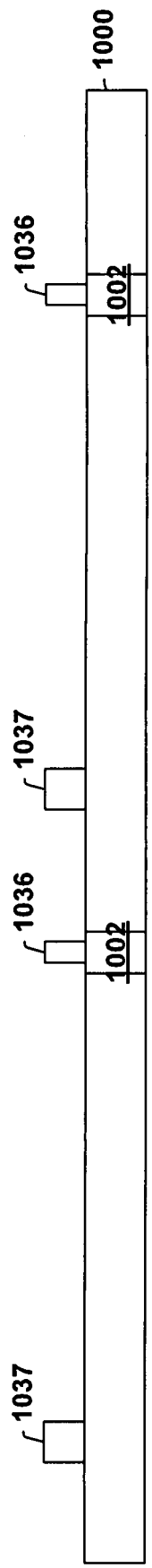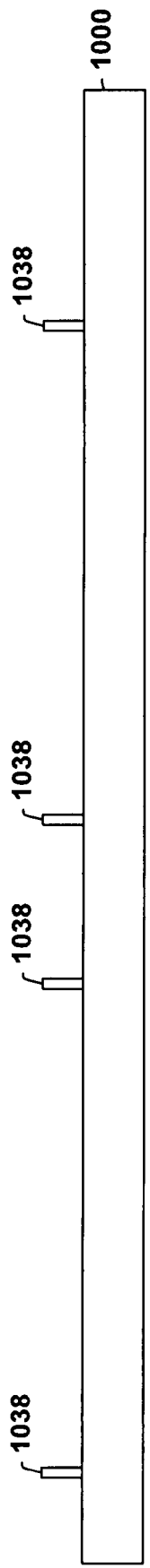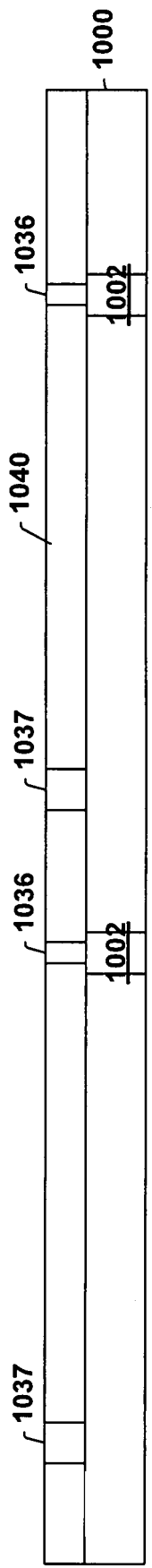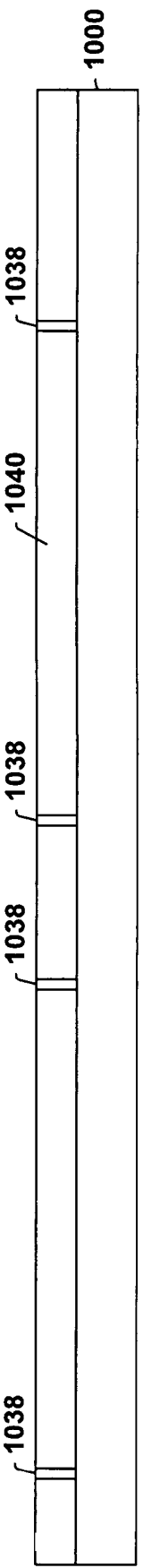

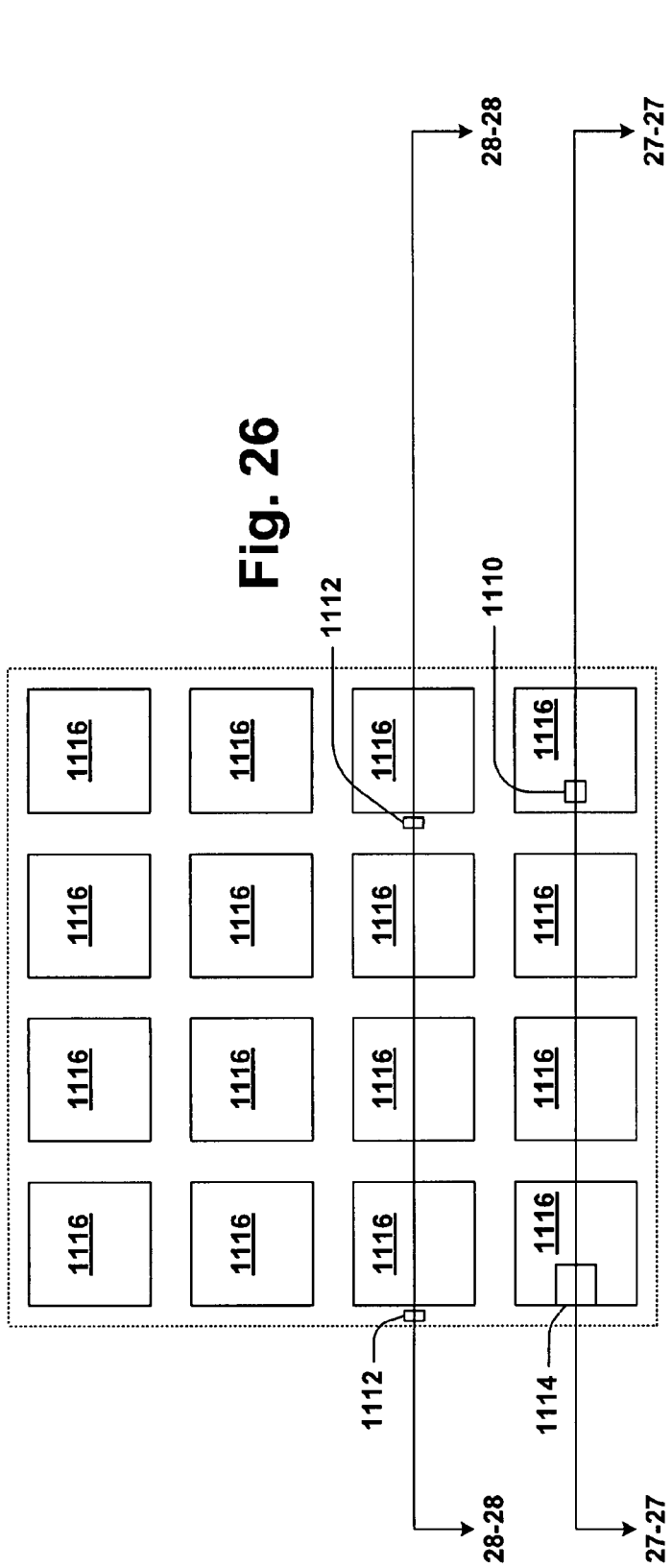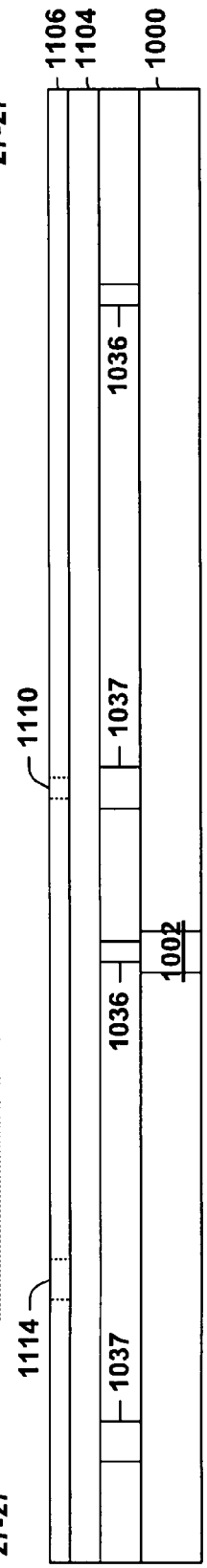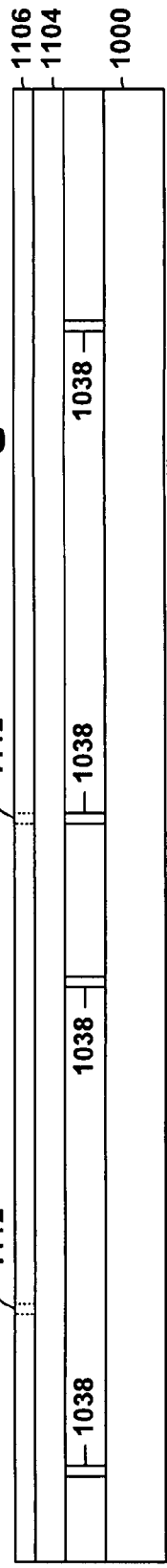

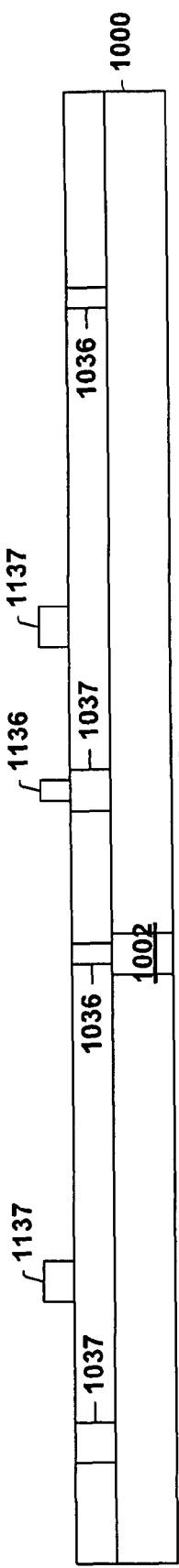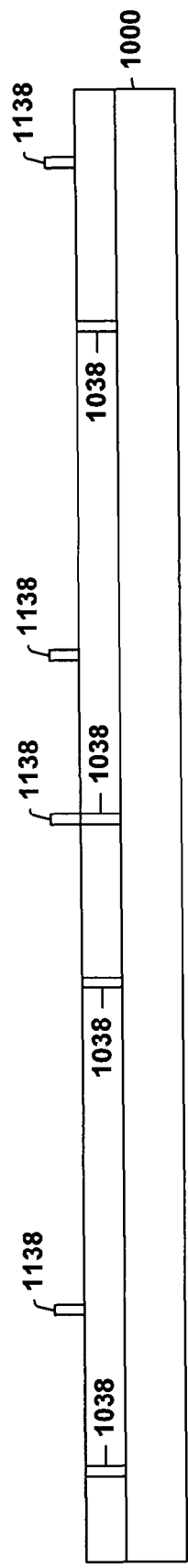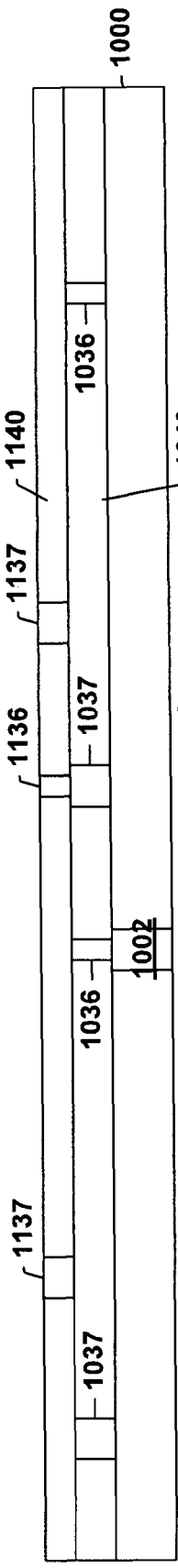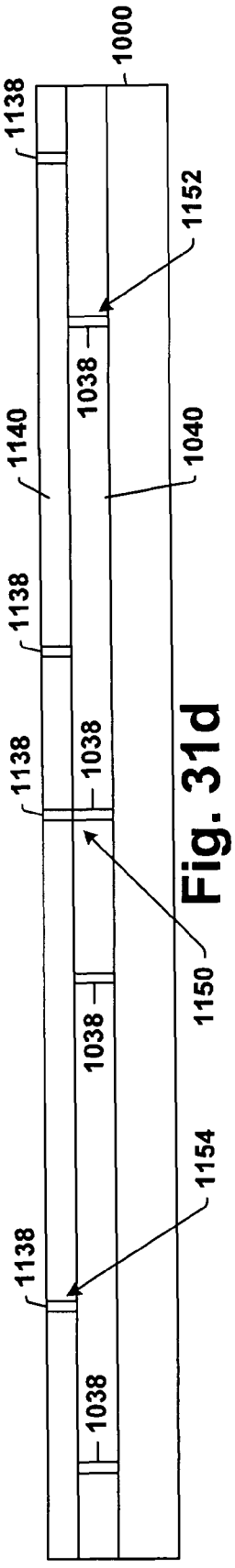

MASK REUSE IN SEMICONDUCTOR PROCESSING

CROSS REFERENCE TO RELATED APPLICATION(S)

This application is related to U.S. patent application Ser. No. 11/772,128, entitled "TEST STRUCTURE FORMATION IN SEMICONDUCTOR PROCESSING" to Li et al., filed on Jun. 30, 2007, and to U.S. patent application Ser. No. 11/772,130, entitled "SEMICONDUCTOR TEST STRUCTURES" to Li et al., filed on Jun. 30, 2007, the entirety of which are hereby incorporated by reference herein.

BACKGROUND

In semiconductor processing, masks are typically not reused. This is due, at least in part, to the fact that when a mask is reused reference marks (alignment and/or overlay marks) from a prior use can interfere with reference marks of a subsequent use.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

A mask is reused to form the same pattern in multiple layers in semiconductor processing. Reference marks that allow alignment accuracy to be checked are also formed with the mask. The manner of using the mask advantageously mitigates interference between reference marks in different layers.

To the accomplishment of the foregoing and related ends, the following description and annexed drawings set forth certain illustrative aspects. Other aspects, advantages and/or features may, however, become apparent from the following detailed description when considered in conjunction with the annexed drawings.

BRIEF DESCRIPTION OF THE DRAWINGS

FIG. 20 illustrates a top view of a semiconductor arrangement after a first resist is exposed for a first time.

FIG. 21 illustrates a cross sectional view of the arrangement of FIG. 20 taken along lines 21-21.

FIG. 22 illustrates a cross sectional view of the arrangement of FIG. 20 taken along lines 22-22.

FIG. 23 illustrates a top view of a semiconductor arrangement after the first resist is exposed for a second time.

FIG. 24 illustrates a cross sectional view of the arrangement of FIG. 23 taken along lines 24-24.

FIG. 25 illustrates a cross sectional view of the arrangement of FIG. 23 taken along lines 25-25.

FIG. 24c illustrates a cross sectional view of the arrangement of FIG. 23 taken along lines 24-24 after the patterned first resist is removed.

FIG. 25c illustrates a cross sectional view of the arrangement of FIG. 23 taken along lines 25-25 after the patterned first resist is removed.

FIG. 24d illustrates a cross sectional view of the arrangement of FIG. 23 taken along lines 24-24 after a dielectric fill has been performed.

FIG. 25d illustrates a cross sectional view of the arrangement of FIG. 23 taken along lines 25-25 after a dielectric fill has been performed.

FIG. 26 illustrates a top view of a semiconductor arrangement after a second resist is exposed for a first time.

FIG. 27 illustrates a cross sectional view of the arrangement of FIG. 26 taken along lines 27-27.

FIG. 28 illustrates a cross sectional view of the arrangement of FIG. 26 taken along lines 28-28.

FIG. 30c illustrates a cross sectional view of the arrangement of FIG. 29 taken along lines 30-30 after the patterned first resist is removed.

FIG. 31c illustrates a cross sectional view of the arrangement of FIG. 29 taken along lines 31-31 after the patterned first resist is removed.

FIG. 30d illustrates a cross sectional view of the arrangement of FIG. 29 taken along lines 30-30 after a dielectric fill has been performed.

FIG. 31d illustrates a cross sectional view of the arrangement of FIG. 29 taken along lines 31-31 after a dielectric fill has been performed.

DETAILED DESCRIPTION

Figure 1:
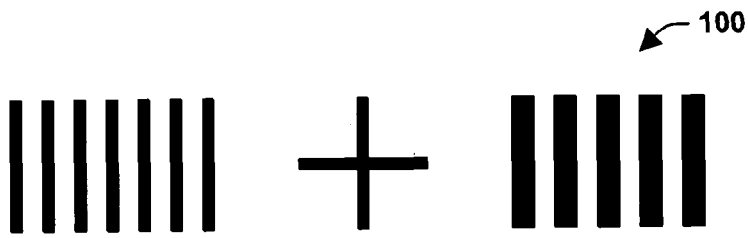
FIG. 1 illustrates an alignment mark.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Lithography generally refers to processes for transferring one or more patterns between various media. In lithography, a light sensitive resist coating is formed over one or more layers to which a pattern is to be transferred. The resist coating is then patterned by exposing it to one or more types of radiation and/or light that (selectively) passes through an intervening mask containing the pattern. The light causes exposed or unexposed portions of the resist coating to become more or less soluble, depending on the type of resist used (positive or negative). A developer is then used to remove the more soluble areas leaving the patterned resist. The patterned resist can then serve as a template for the underlaying layer or layers which can be selectively etched (or doped or otherwise treated). Once the underlaying layer is treated, the patterned resist is removed (e.g., chemically stripped) leaving the treated layer (e.g., having the pattern formed therein).

In semiconductor processing, multiple masks are used to form respective patterns in different layers. It can be appreciated that it is important to precisely align the masks to a substrate and/or to one or more other (previously established) layers. Reference marks are used to accomplish and evaluate the alignment of masks. Reference marks come in two types: alignment marks and overlay marks. Alignment marks are used to align a mask to a substrate and/or one or more other layers, while overlay marks are used to evaluate the accuracy of the alignment.

Figure 2A:
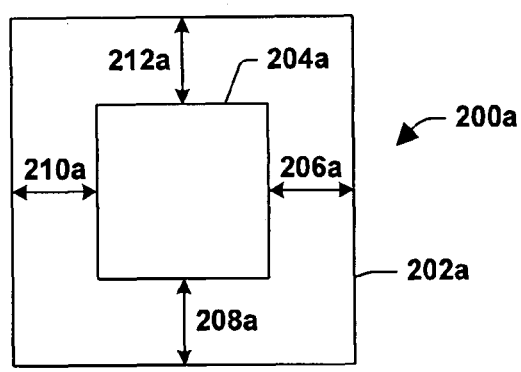
FIG. 2*a* illustrates reference marks in a substantially true or aligned situation.
Figure 2B:
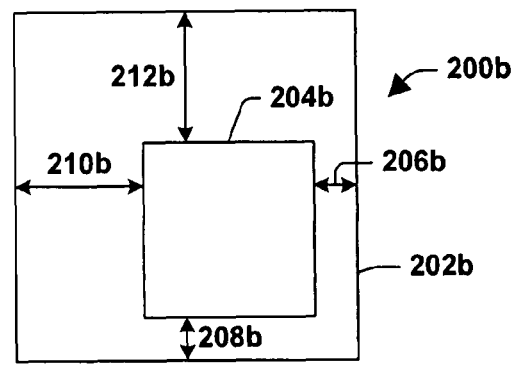
FIG. 2*b* illustrates reference marks in an un-true or mis-aligned situation.

FIG. 1 illustrates an alignment mark 100. Elements of the lithography system, such as a stepper, for example, look for this alignment mark in a substrate and/or or other underlaying layer, and place the mask relative to it. It will be appreciated that the mask is generally stationary, and the substrate or wafer is typically moved relative to the mask. FIGS. 2a and 2b illustrate overlay marks 200a, 200b. Target overlay marks 202a, 202b are formed in the layer being aligned to and measured overlay marks 204a, 204b (coincident with the target overlay marks) are formed in the layer that is being aligned. FIG. 2a illustrates substantially true alignment where the measured overlay mark 204a is substantially centered within the target overlay mark 202a so that the distance between these marks is substantially the same on all sides (206a=208a=210a=212a). FIG. 2b illustrates an alignment that is not substantially true such that the measured overlay mark 204b is not centered within the target overlay mark 202b and the distance between these marks is thus different at different locations (206b≠210b, 208b≠212b).

Figure 2C:
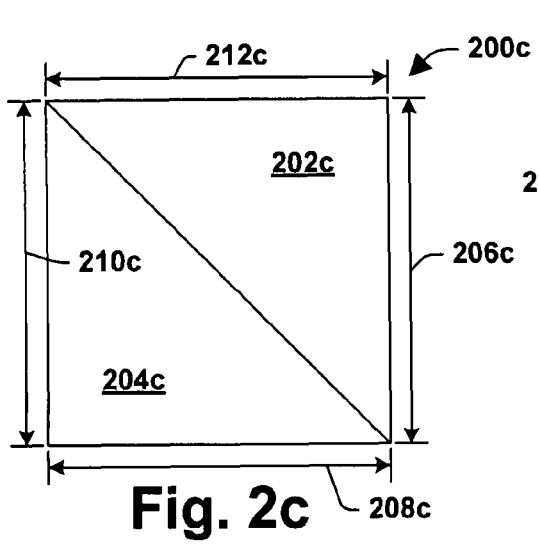
FIG. 2*c* illustrates reference marks in a substantially true or aligned situation.
Figure 2D:
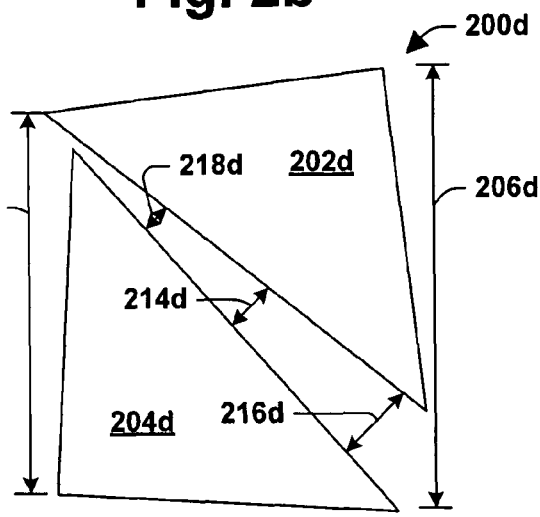
FIG. 2*d* illustrates reference marks in an un-true or mis-aligned situation.

It will be appreciated that while the illustrated overlay marks are substantially square, different overlay marks may be implemented, such as concentric circles, for example. Similarly, such marks may comprise any other features that may be "coincident" with one another (and/or whose degree of coincidence can be examined). For example, right triangle overlay marks 200c, 200d are illustrated in FIGS. 2c and 2d, where one triangle would be formed in the layer being aligned to and the other triangle would be formed in the layer being aligned. As illustrated in FIG. 2c, substantially true alignment can be ascertained, for example, when the triangles 202c, 204c end up adjacent to one another so as to form a square such that the length on all sides is substantially the same (206c=208c=210c=212c) (and there is substantially no separation between the triangles). FIG. 2d illustrates a less than true alignment situation, which can be ascertained, for example, by finding differing lengths around the sides of the marks (206d≠210d), separation between the marks (214d), and/or variation in the separation between the marks (216d≠218d).

Regardless of the shapes of the marks, there is generally little risk of interference between marks in a current layer and marks in one or more previous layers because different masks are used to pattern different layers, and the different masks are unique—thus producing alignment and/or overlay marks in different locations. Where a mask is to be reused to form the same pattern in multiple layers, however, interference may occur.

Figure 3:
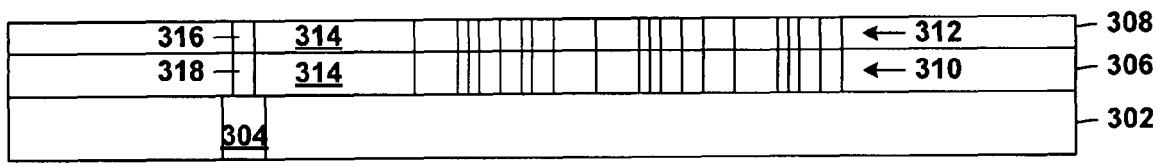
FIG. 3 illustrates a situation in semiconductor processing where interference may be experienced between reference marks.

Turning to FIG. 3, for example, an underlaying layer 302 (e.g., a substrate) that is being aligned to has a target mark 304 formed therein. A first layer 306 is formed over the underlaying layer 302 and a second layer 308 is formed over the first layer 306. In the illustrated example, the same mask was used to pattern the first 306 and the second 308 layers such that the first layer 306 has a first pattern 310 that is aligned with a second pattern 312 in the second layer 308. That is, the features 312 formed in second layer 308 have the same footprint as (or are formed on top of) the features 310 formed in the first layer 306 (where a dielectric material 314 is used to fill in between the features in the first 306 and second 308 layers). Unfortunately, however, this similarly causes a measured overlay mark 316 in the second layer 308 to be formed directly above or coincident with a measured overlay mark 318 in the first layer 306. Accordingly, while the measured mark 318 in the first layer 306 may be used to check the alignment between the first layer 306 and the underlaying layer 302 (by examining the relative orientation between this mark 318 and the target mark 304 in the underlaying layer), this same mark 318 interferes with checking the alignment between the second layer 308 and the underlaying layer 302 (by inhibiting the examination of the relative orientation between the measured mark 316 in the second layer 308 and the target mark 304 in the underlaying layer 302).

To overcome the problem of interference between reference marks in different layers, different masks could be used which would be identical except for the placement of the reference marks. For example, the measured overlay mark on the mask used the pattern the second layer 308 would be at a different location than the measured overlay mark on the mask used to pattern the first layer 306. In this manner, the measured mark 318 in the first layer 306 would not interfere with the measured mark 316 in the second layer 308. Masks can be very expensive, however, making this an unattractive option.

Figure 4:
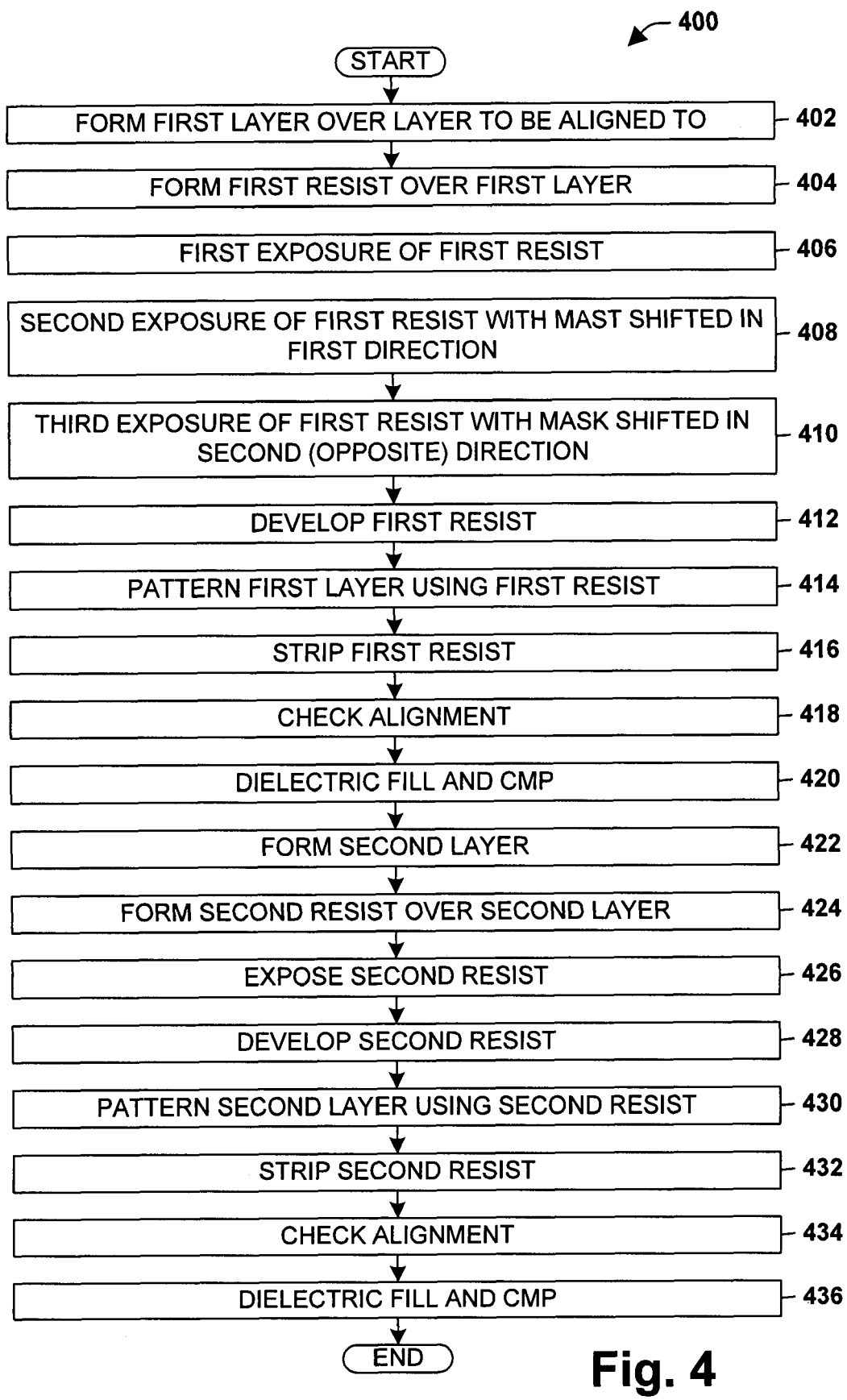
FIG. 4 illustrates a methodology for reusing the same mask to pattern multiple layers while mitigating alignment/interference issues.

Accordingly, an example methodology 400 for reusing the same mask to form coincident patterns in multiple layers while mitigating alignment/interference issues is illustrated in FIG. 4, and an example semiconductor substrate 600 where-over such a methodology is implemented is generally illustrated in FIGS. 6-17. It will be appreciated that substrate and/or semiconductor substrate as used herein may comprise any type of semiconductor body (e.g., silicon, SiGe, SOI) such as a semiconductor wafer and/or one or more die on a wafer, as well as any other type of semiconductor and/or epitaxial layers formed thereover or otherwise associated therewith. Also, while the method 400 (as well as other methods described herein) is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects and/or embodiments of the description herein. Further, one or more of the acts depicted herein may be carried out in one or more separate acts and/or phases.

Figure 5:
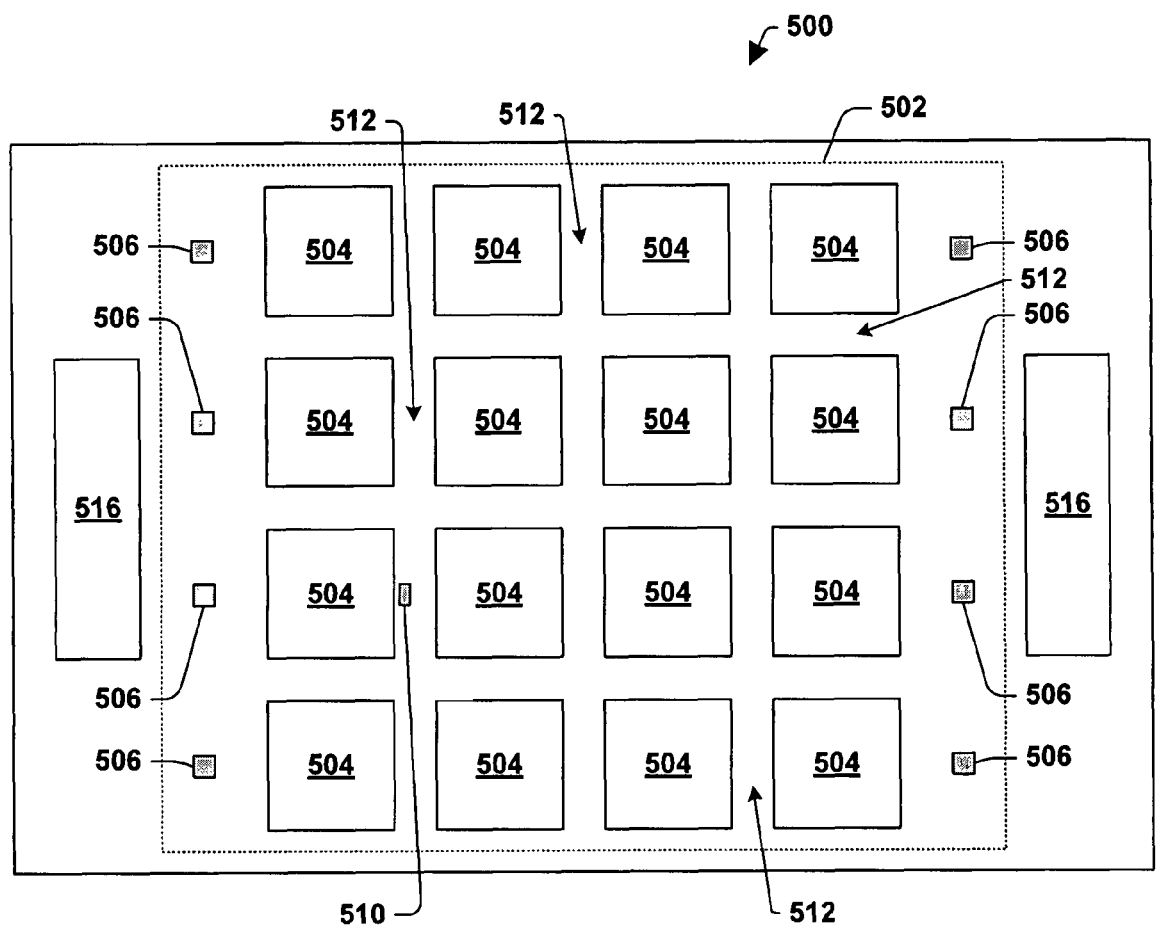
FIG. 5 illustrates a mask that can be used to pattern multiple layers while mitigating alignment/interference issues.

An example mask 500 that can be used to facilitate the methodology 400 is illustrated in FIG. 5. The mask 500 has an exposure area 502 (phantom) that comprises the features, patterns, etc. that are to be transferred onto an underlaying layer. In the illustrated example, sixteen squares 504 are comprised within area 502 (although any suitable number may be implemented). These squares 504 generally correspond to die on a wafer/semiconductor substrate such that features, patterns, etc. that are to be transferred onto respective die are comprised within these areas 504. For simplicity and ease of understanding, these features, patterns, etc. are not illustrated, because they are generally too small and too numerous to be depicted accurately, at least relative to reference marks. For example, an integrated circuit (IC) layout that is to be repeatedly formed on respective die may comprise millions of features corresponding to transistors and/or other semiconductor devices, for example.

In the illustrated example, the mask 500 also comprises eight areas 506 that facilitate forming measured overlay marks in an underlaying layer (although any suitable number may be implemented). Similarly, the mask 500 comprises one area 510 that facilitates forming a test structure in an underlaying layer (although any suitable number may be implemented). Areas 506 and 510 (as well as other areas of the mask 500 (e.g., squares 504) having features, patterns, etc. that are to be transferred to an underlaying layer) are treated in some manner to protect underlaying areas (of a resist). For example, these areas may comprise an opaque material (e.g., chrome) that inhibits light and/or radiation from passing there-through. Additionally/alternatively, these areas may be configured to phase shift incoming light/radiation so that the light/radiation has less of an effect with regard to making underlaying areas of a resist soluble (or insoluble depending upon the type of resist used) when the light/radiation impinges thereon.

The test structure defining area 510 is formed in an area 512 of the mask corresponding to a scribe line in the illustrated example. Scribe lines are sacrificial areas that are lost when the die are cut from the wafer/substrate. Forming a test structure in a scribe line thus allows a mechanism to be developed that can be accessed or "tested" throughout the fabrication process to provide feedback on the quality and/or progress of the process (e.g., by continually yielding measurements of one or more performance characteristics as the process proceeds) without having to occupy valuable semiconductor real estate in a die. Nevertheless, as will be appreciated, test structures can be formed at any location, including in die.

Two openings 516 are formed outside of the exposure area 502 of the mask 500 in the illustrated example (although any suitable number may be implemented). As will be appreciated, these openings 516 are used to remove reference marks from an exposed or patterned resist. In particular, after an initial exposure wherein measured overlay marks, test structure and other features, patterns, etc. (e.g., as defined by areas 506, 510 and other areas of the mask—not shown) are transferred to a resist (but before the resist is developed), the openings 516 are used to remove at least one, but less than all, of the marks from the resist. Essentially, the mask is shifted so that the marks to be removed are located within/under one of the openings 516. Accordingly, when a subsequent exposure is performed, the light/radiation directly impinges upon these areas of the resist, causing them to have the same solubility/insolubility as surrounding areas that were previously exposed so that they are likewise removed when the resist is developed. It will be appreciated that while reference is made herein to shifting the mask, that generally the substrate/wafer/underlaying layer(s) is actually moved (e.g., by a stepper), with the mask remaining substantially stationary. Accordingly, this relative movement between the mask and the substrate/wafer/underlaying layer(s) is what is meant when mask shifting (or some variation thereof) is mentioned and/or described herein, with the understanding that typically little, if any, of the movement is on the part of the mask.

Figure 6:
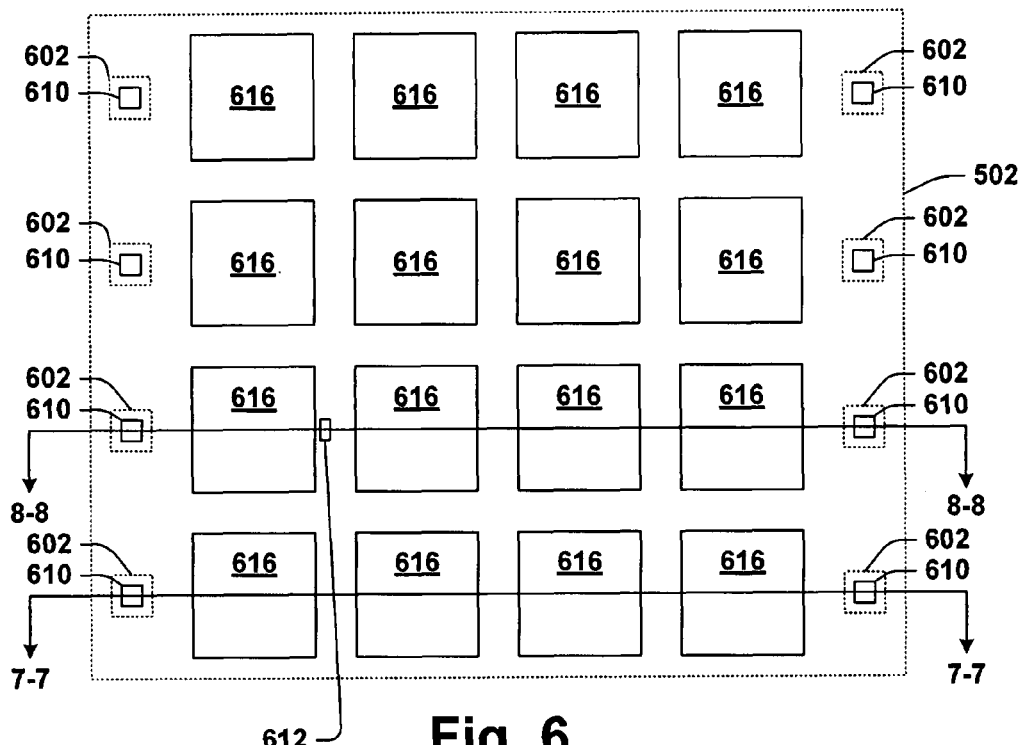
FIG. 6 illustrates a top view of a semiconductor arrangement after a first resist is exposed for a first time.
Figure 7:
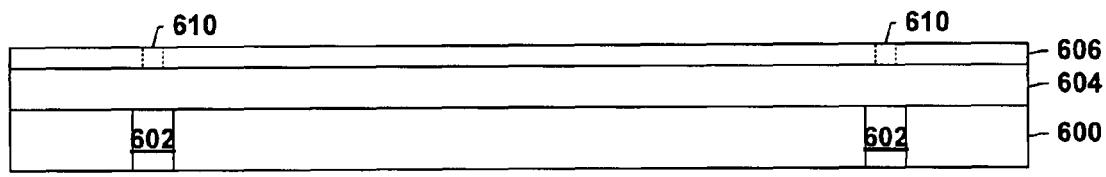
FIG. 7 illustrates a cross sectional view of the arrangement of FIG. 6 taken along lines 7-7.
Figure 8:
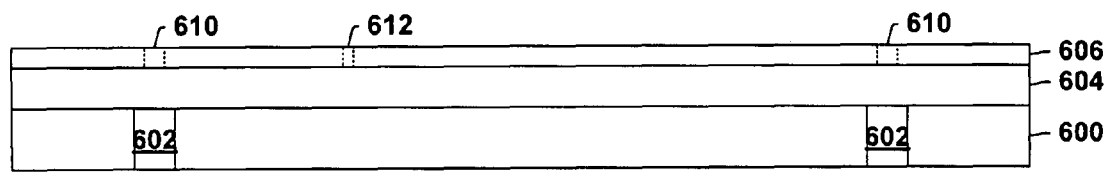
FIG. 8 illustrates a cross sectional view of the arrangement of FIG. 6 taken along lines 8-8.

At the outset of the method 400, a first layer 604 is formed over a layer 600 to be aligned to (and thus which has one or more target overlay marks 602 formed therein) at 402 (FIGS. 6-8). This first layer 604 (as well as any and all layers described herein) may comprise any suitable material and be formed to any desired thickness. In one example, the first layer 604 comprises a semiconductor material, such as polysilicon, and is formed to a thickness of between about 100 nanometers and about 400 nanometers, for example. It will be appreciated that the first layer (as well as any and all of the other layers described herein) can be formed in any suitable manner, such as with growth, deposition, spin-on and/or sputtering techniques, for example.

At 404, a first resist 606 is formed over the first layer 604 and is exposed for a first time through the mask 500 (FIG. 5) at 406 (FIGS. 6-8). This exposure causes areas 610, 612 of the first resist 606 protected by the mask 500 to become soluble (or insoluble, depending on the type of resist used) relative to other unprotected/exposed areas of the resist. Accordingly, areas 610, 612 of the first resist which were covered by areas 506 and 510, respectively, of the mask 500 are illustrated in phantom in FIGS. 7 and 8 to indicate this difference in solubility (and this is maintained throughout the Figs.—the target overlay marks 602 being illustrated in phantom in FIG. 6 (and in similar Figs. throughout) to indicate that they are present in an underlaying layer). It will be appreciated that many other areas of the first resist 606 (e.g., corresponding to features, patterns, etc. to be formed on the respective die) would also possess this different solubility, but are not illustrated for purposes of simplicity. Additionally, FIG. 6 illustrates a top view of the first resist 606 after the first exposure is performed at 406 (rather than a view of the mask 500 as in FIG. 5). The 16 squares 616 thus represent areas of the first resist 606 that would contain features, patterns, etc. (not shown) that are to be transferred to layers on respective die. For simplicity and ease of understanding these areas 616 are not depicted in the cross sections illustrated in FIGS. 7 and 8 (or in other like Figs.).

Figure 9:
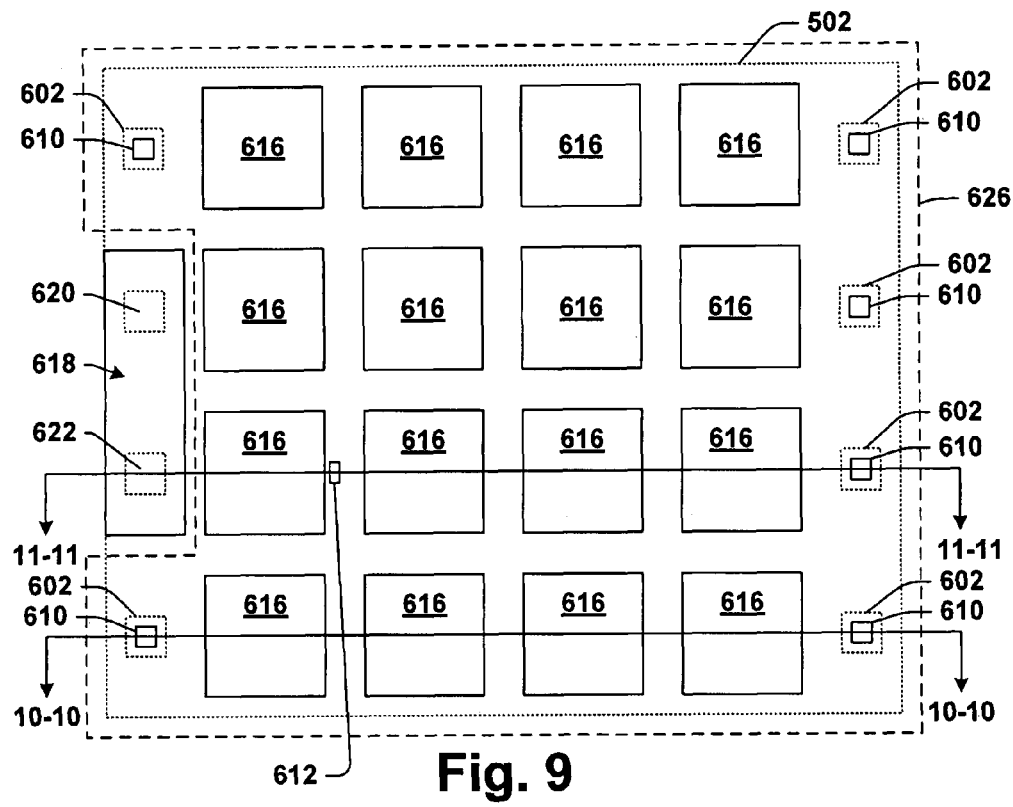
FIG. 9 illustrates a top view of a semiconductor arrangement after the first resist is exposed for a second time.
Figure 10:
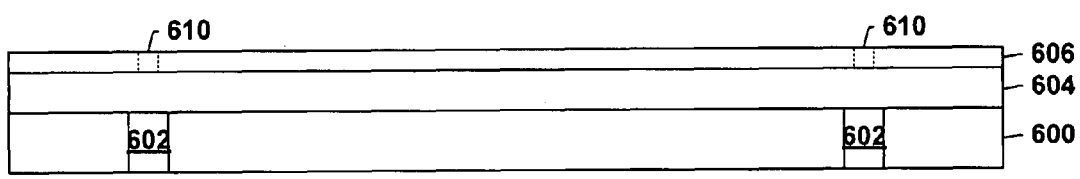
FIG. 10 illustrates a cross sectional view of the arrangement of FIG. 9 taken along lines 10-10.
Figure 11:
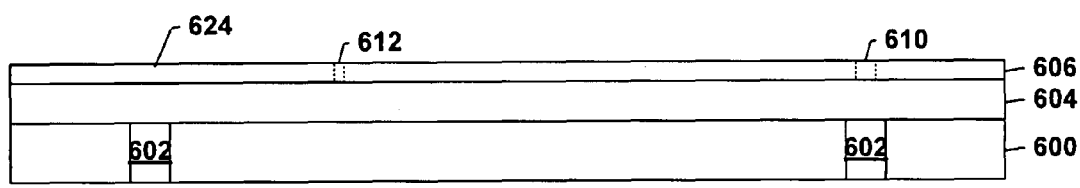
FIG. 11 illustrates a cross sectional view of the arrangement of FIG. 9 taken along lines 11-11.

After the first exposure, the mask 500 is shifted in a first direction and a second exposure is performed at 408 (FIGS. 9-11). It can be seen (generally at 618) in FIG. 9 that the mask is shifted relative to the first resist 606 such that one or more of the areas 610 of the first resist 606 which were covered by areas 506 of the mask 500 during the first exposure, were visible through one of the openings 516 in the mask 500 during the second exposure. Accordingly, these areas now have the same solubility as other areas of the first resist 606 that were exposed during the first exposure at 406 (see the absences at 620, 622, 624). So that the rest of the first resist 606 is not affected during the second exposure at 408, the remainder of first resist 606 is covered by some type of material (e.g., a shutter present on lithography equipment) during the second exposure. This is illustrated in dashed 626 in FIG. 9 (and FIG. 12).

Figure 12:
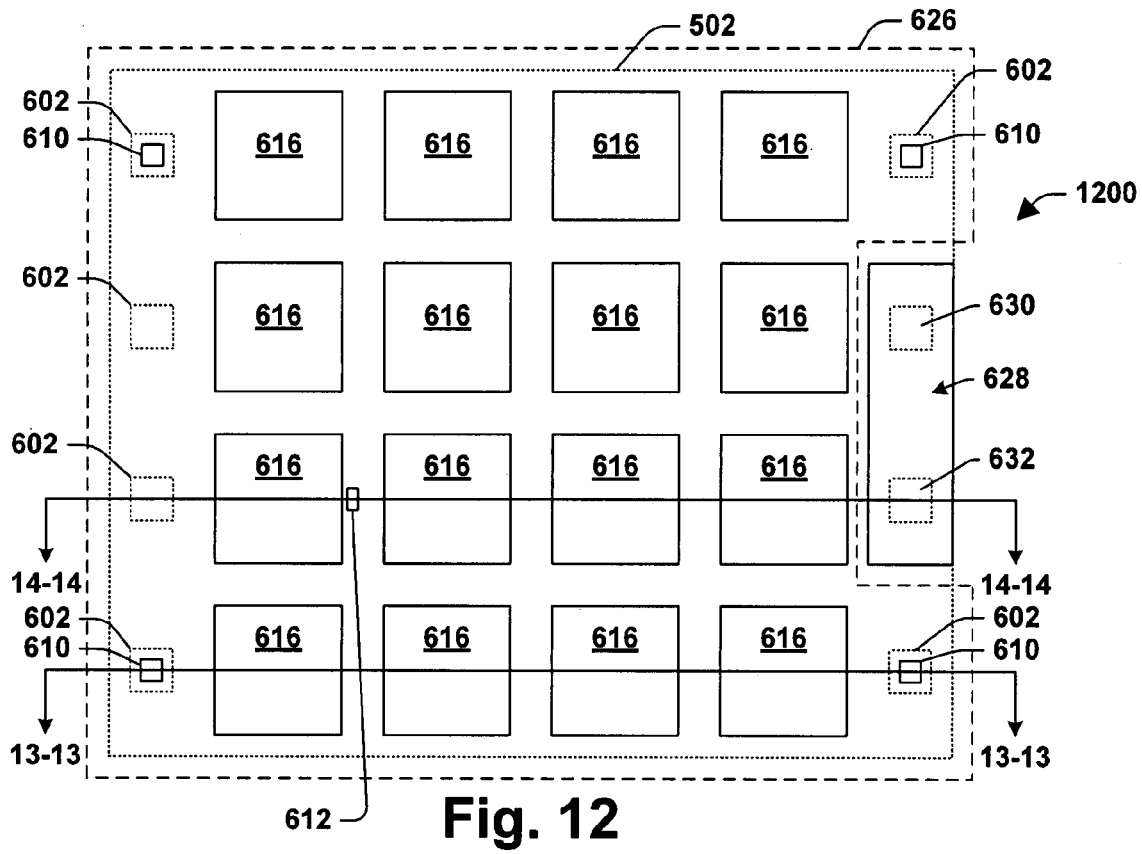
FIG. 12 illustrates a top view of a semiconductor arrangement after the first resist is exposed for a third time.
Figure 13:
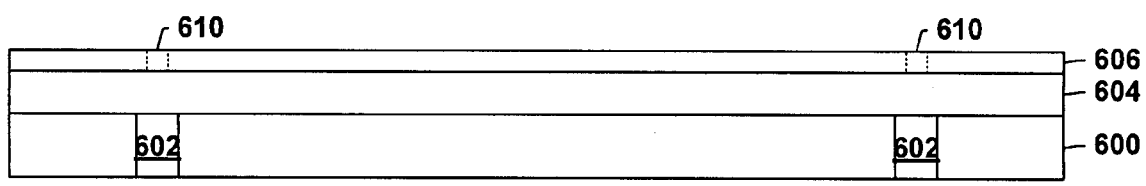
FIG. 13 illustrates a cross sectional view of the arrangement of FIG. 12 taken along lines 13-13.
Figure 14:
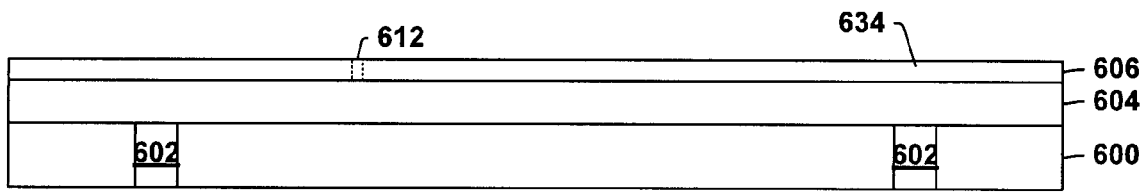
FIG. 14 illustrates a cross sectional view of the arrangement of FIG. 12 taken along lines 14-14.

At 410, the mask is shifted relative to the first resist 606 in a second (opposite) direction and a third exposure is performed (FIGS. 12-14). In this manner, additional (formerly protected) areas of the first resist are "removed" from "exposed" area 628 (see the absences at 630, 632, 634), with the remainder of the first resist 606 again protected by (the reconfigured) material 626. It will be appreciated that while shifting the mask 500 in a first direction and then shifting the mask 500 in a second (opposite) direction is illustrated and described, the mask 500 can be shifted in any suitable manner to "remove" one or more reference mark areas formed within the first resist 606. Moreover, these reference mark areas can be formed anywhere on the first resist 606 and the mask 500 can be shifted in any manner, including a single time, to "remove" one or more of these reference mark areas from the first resist 606. For example, these areas may be formed within locations corresponding to scribe lines on the semiconductor substrate and/or anywhere else including areas corresponding to active and/or inactive areas on the die. Further still, the mask 500 may be configured in any manner (e.g., have any number of openings formed anywhere therein) that would allow reference marks to subsequently be "removed" by the mask.

Figure 13A:
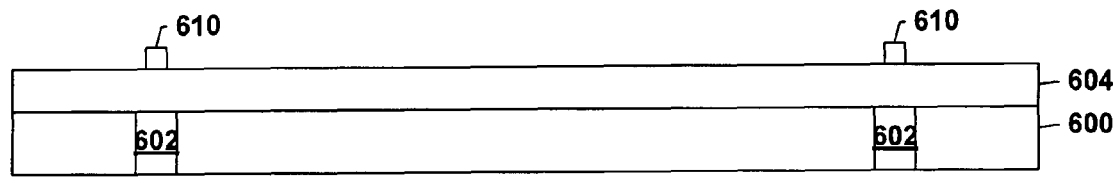
FIG. 13*a* illustrates a cross sectional view of the arrangement of FIG. 12 taken along lines 13-13 after the first resist is developed.
Figure 14A:
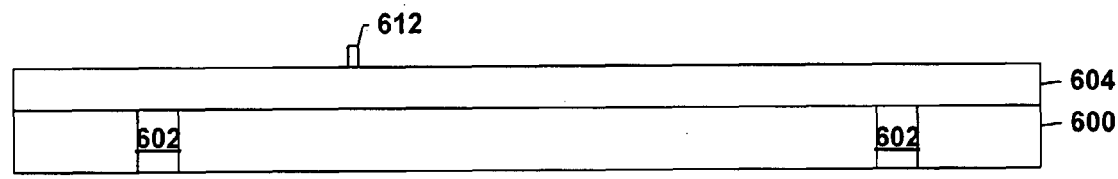
FIG. 14*a* illustrates a cross sectional view of the arrangement of FIG. 12 taken along lines 14-14 after the first resist is developed.
Figure 13B:
FIG. 13*b* illustrates a cross sectional view of the arrangement of FIG. 12 taken along lines 13-13 after a first layer is patterned.
Figure 14B:
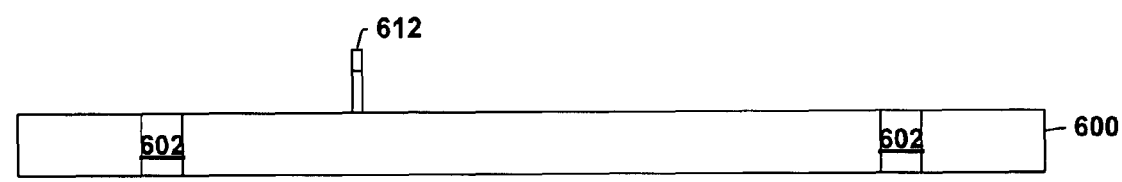
FIG. 14*b* illustrates a cross sectional view of the arrangement of FIG. 12 taken along lines 14-14 after the first layer is patterned.

With the desired pattern "formed" in the first resist 606, the method 400 advances to 412 where the first resist 606 is developed (FIGS. 13a, 14a). The portions of the first resist 606 not protected by the mask 500 are removed leaving only the portions 610, 612 of the first resist 606 that were protected by the mask 500 (the many other remaining portions (over die) are not shown). At 414, the patterned first resist 606 is used to pattern (e.g., via etching) the first layer 604 (FIGS. 13b, 14b). The patterned first resist 606 is then removed (e.g., chemically stripped) at 416 to reveal measured overlay marks 636 and a test structure 638 formed from the first layer 606 (FIGS. 13c, 14c).

Figure 13C:
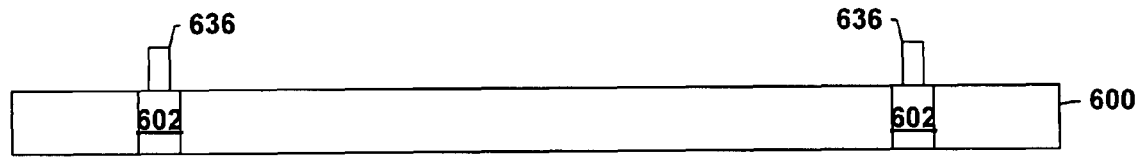
FIG. 13*c* illustrates a cross sectional view of the arrangement of FIG. 12 taken along lines 13-13 after the patterned first resist is removed.
Figure 14C:
FIG. 14*c* illustrates a cross sectional view of the arrangement of FIG. 12 taken along lines 14-14 after the patterned first resist is removed.
Figure 13D:
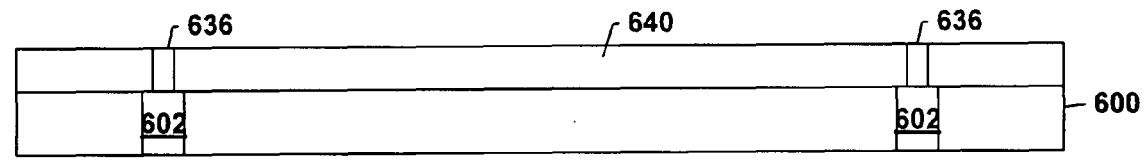
FIG. 13*d* illustrates a cross sectional view of the arrangement of FIG. 12 taken along lines 13-13 after a dielectric fill has been performed.
Figure 14D:
FIG. 14*d* illustrates a cross sectional view of the arrangement of FIG. 12 taken along lines 14-14 after a dielectric fill has been performed.

Alignment can then be checked at 418 by comparing (the degree of coincidence between) the measured overlay marks 636 in the first layer 604 to the target overlay marks 602 in the underlaying layer 600 (FIG. 13c). It will be appreciated that alignment may also be checked just after the first resist 606 is developed at 412 (FIGS. 13a, 14a). This may be desirable as it may, among other things, allow adjustments to be made before any (expensive) layers are etched. For example, if (too much) misalignment is detected, the patterned first resist can be removed and another (first) resist put down and the process repeated, where resist material is generally more readily (e.g., more cost effectively) sacrificed than other layers (e.g., layer 604). Areas between the measured overlay marks 636, the test structure 638 and other patterned features (not shown) in the first layer 604 are then filled in with a dielectric or nonconductive material 640, such as silicon dioxide, for example, at 420 (FIGS. 13d, 14d). Generally, such a layer of material is formed over the first layer 604, or rather the features formed/remaining there-from, and then polished back by an optional chemical mechanical polishing (CMP) process to be uniform or flush with the features formed within the first layer. CMP is optional because it may be too aggressive for very thin layers.

Figure 15:
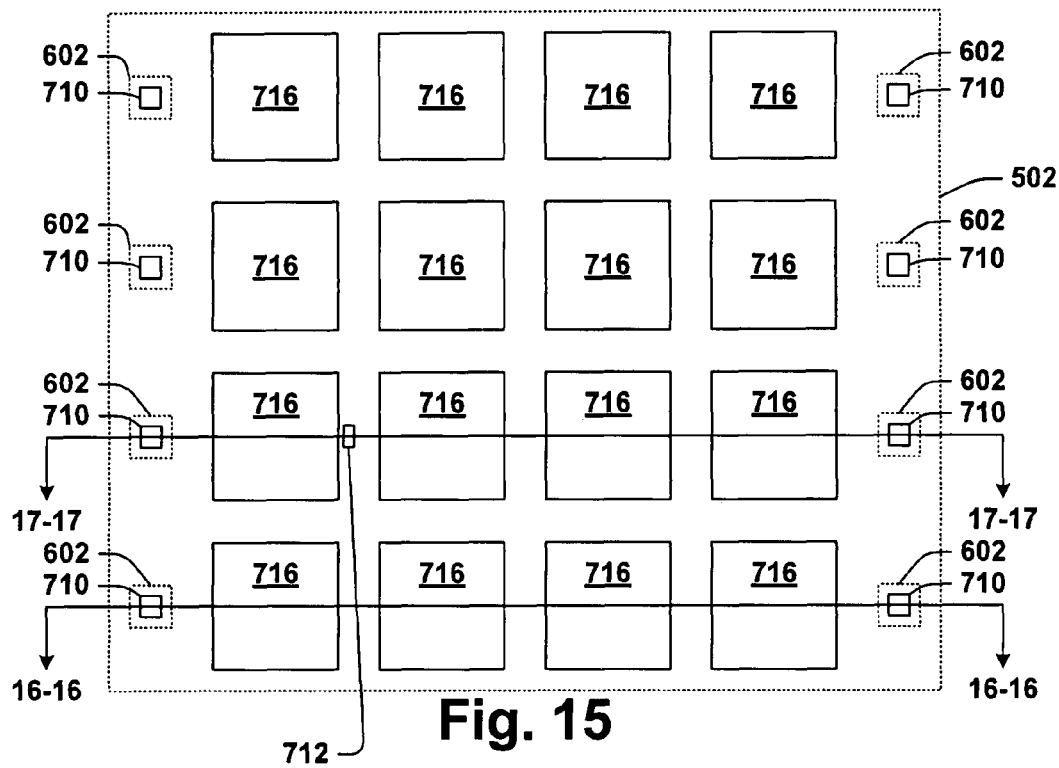
FIG. 15 illustrates a top view of a semiconductor arrangement after a second resist is exposed for a first time.
Figure 16:
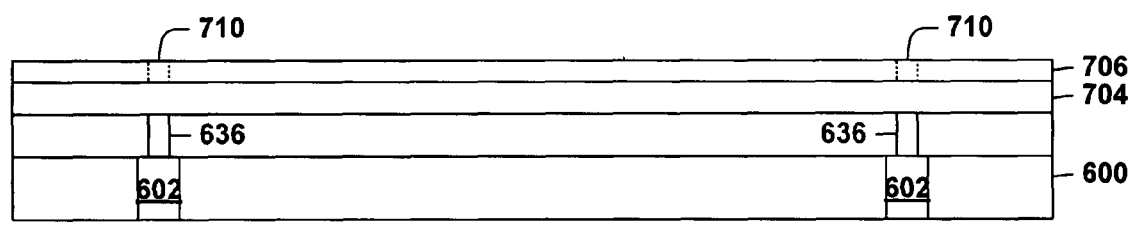
FIG. 16 illustrates a cross sectional view of the arrangement of FIG. 15 taken along lines 16-16.
Figure 17:
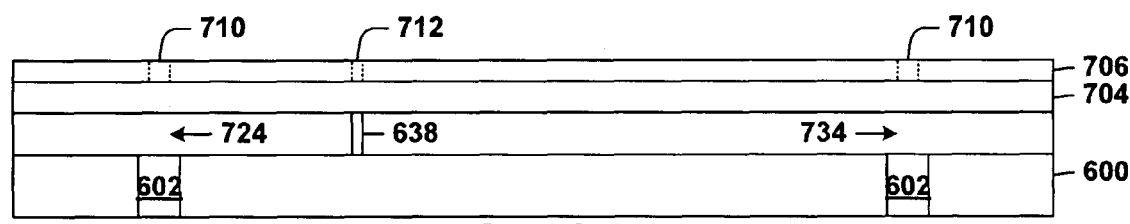
FIG. 17 illustrates a cross sectional view of the arrangement of FIG. 15 taken along lines 17-17.

With the first layer 604 patterned, a second layer 704 is formed at 422 and a second resist 706 is formed over the second layer 704 at 424 (FIGS. 15-17). The second layer 704 may comprise metal oxide, for example, and may be formed to a thickness of between about 1 nanometer and about 10 nanometers, for example. The same mask 500 is then used to expose the second resist 706 at 426 (FIGS. 15-17). This produces the same result in the second resist 706 that was produced in the first resist 606 by the first exposure at 406 (FIGS. 6 and 15). It will be appreciated that at least one of the areas 710 of the second resist 706 protected by an area 506 of the mask 500 is aligned with a location 724, 734 where a corresponding area 610 was "removed" from the first resist 606 by the second and/or third exposures of the first resist 606 at 408 and/or 410 (FIG. 17). As will be appreciated, this will facilitate examining the alignment of the second layer 704 to the underlying layer 600.

Figure 16A:
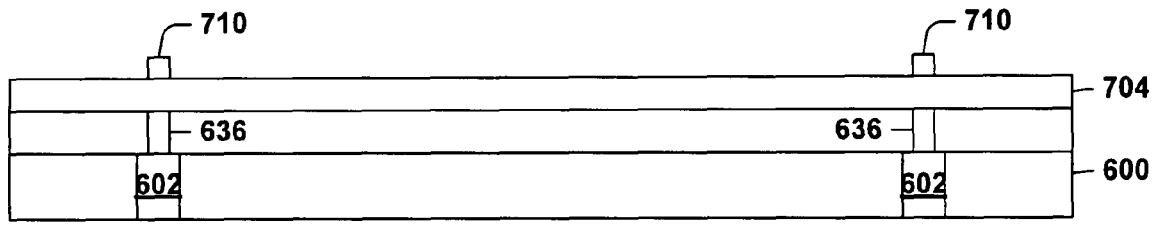
FIG. 16*a* illustrates a cross sectional view of the arrangement of FIG. 15 taken along lines 16-16 after the second resist is developed.
Figure 17A:
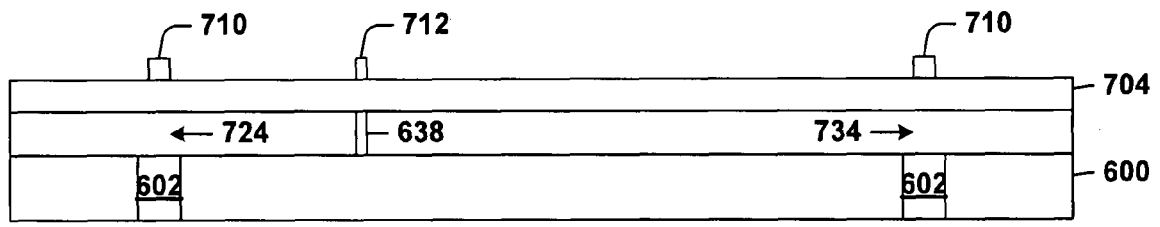
FIG. 17*a* illustrates a cross sectional view of the arrangement of FIG. 15 taken along lines 17-17 after the second resist is developed.

The second resist 706 is developed at 428 so that portions of the second resist 706 not protected by the mask 500 are removed (FIGS. 16a, 17a). As such, merely portions 710, 712 of the second resist 706 that were protected by the mask 500 remain (the many other remaining portions (over die) are not shown). It will be appreciated that the portions 710 of the second resist 706 illustrated in FIG. 17a are aligned with locations 724, 734 where a corresponding area 610 was "removed" from the first resist 604 by the second and/or third exposures of the first resist 606 at 408 and/or 410.

Figure 16B:
FIG. 16*b* illustrates a cross sectional view of the arrangement of FIG. 15 taken along lines 16-16 after a second layer is patterned.
Figure 17B:
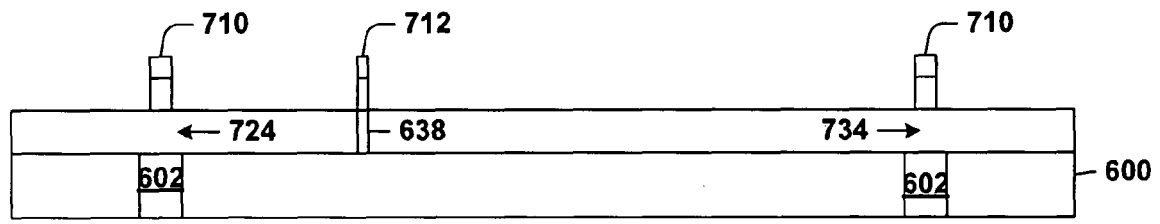
FIG. 17*b* illustrates a cross sectional view of the arrangement of FIG. 15 taken along lines 17-17 after the second layer is patterned.
Figure 16C:
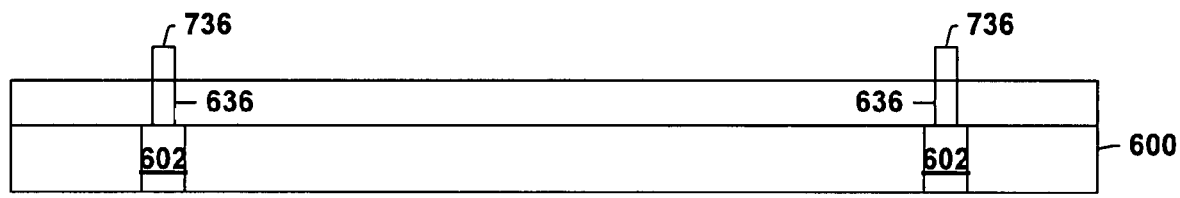
FIG. 16*c* illustrates a cross sectional view of the arrangement of FIG. 15 taken along lines 16-16 after the patterned second resist is removed.
Figure 17C:
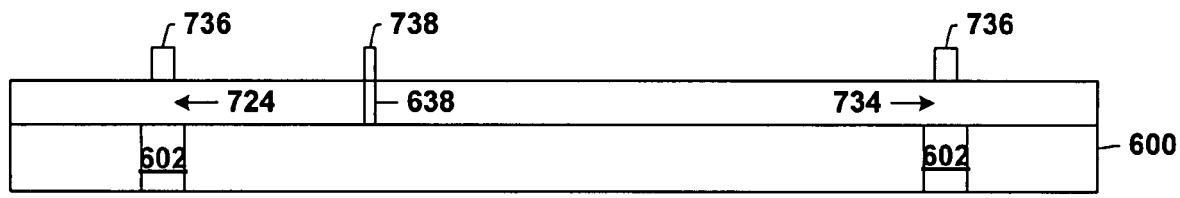
FIG. 17*c* illustrates a cross sectional view of the arrangement of FIG. 15 taken along lines 17-17 after the patterned second resist is removed.
Figure 16D:
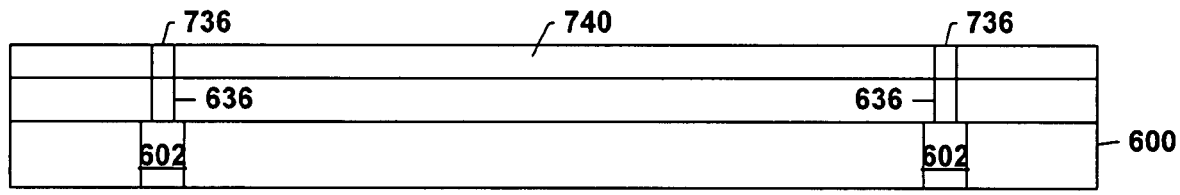
FIG. 16*d* illustrates a cross sectional view of the arrangement of FIG. 15 taken along lines 16-16 after a dielectric fill has been performed.
Figure 17D:
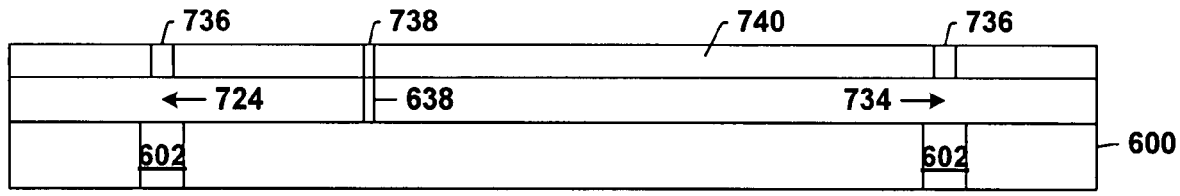
FIG. 17d illustrates a cross sectional view of the arrangement of FIG. 15 taken along lines 17-17 after a dielectric fill has been performed.

At 430, the patterned first resist 706 is used to pattern (e.g., via etching) the second layer 704 (FIGS. 16b, 17b). The patterned second resist 706 is then removed (e.g., chemically stripped) at 432 to reveal measured overlay marks 736 and a test structure 738 formed from the second layer 706 (FIGS. 16c, 17c—note the absence of corresponding features in FIG. 14c). Alignment can then be checked at 434 by comparing (the degree of coincidence between) the measured overlay marks 736 in the second layer in FIG. 17c to the target overlay marks 602 in the underlying layer 600. Similar to the discussion above with regard to checking alignment at 418, alignment can also be checked just after the second resist 706 is developed. Areas between the measured overlay marks 736, the test structure 738 and other patterned features (not shown) in the second layer 704 are then filled in with a dielectric or nonconductive material 740, such as silicon dioxide, for example at 436 (FIGS. 16d, 17d). Generally, such a layer of material is formed over the second layer 704, or rather the features formed/remaining there-from, and then polished back by an optional chemical mechanical polishing (CMP) process to be uniform or flush with the features formed within the second layer. CMP is optional because it may be too aggressive for very thin layers.

Note that the absence of marks at locations 724, 734 allows the measurement at 434 to be taken without interference. Measured overlay marks 636 thus allow the alignment of the first layer 604 to the underlaying layer 600 to be checked (FIG. 13c), while the measured overlay marks 736 allow the alignment of the second layer 704 to the underlaying layer 600 to be checked (FIG. 17c). Additionally, the test structure now comprises features 638, 738 so that performance characteristics at this stage of the process can be examined. For example, given that the features of the test structure are formed concurrently with the formation of features in corresponding layers, the test structures generally model the behavior of semiconductor devices formed on the die. In the illustrated example, the test structure may model a memory cell comprising a diode in the form of a pillar, for example, where feature 638 corresponds to a semiconductor and feature 738 corresponds to an antifuse.

A memory cell comprising a semiconductor and an antifuse operates, at least in part, because it has a first electrical conductivity before a program voltage is applied across the diode pillar and a second electrical conductivity after a program voltage is applied across the diode pillar. More particularly, because the antifuse 738 generally comprises dielectric material, it is in a first conductivity state before a program voltage is applied and is in a second conductivity state after a program voltage is applied to the cell. That is, when a sufficient voltage is applied (e.g., a program voltage), one or more of the properties of the antifuse 738 are altered so that current can more easily pass therethrough. For example, the antifuse 738 can be said to rupture, undergo a phase change, have a different charge storage capability, etc. The electrical conductivity of the diode pillar is thus significantly increased after the antifuse 738 is altered. The cell can thus be considered as storing a binary 0 or 1 before the antifuse is altered (unprogrammed) and a binary 1 or 0 after the antifuse is altered (programmed). Determining whether the cell is programmed or unprogrammed can be accomplished, for example, by applying a certain voltage across the diode pillar and measuring the current there-through, where the applied voltage is known to instill a particular current when the antifuse is ruptured and a different (e.g., substantially zero) current when the antifuse is intact. It can be appreciated the conductivity of the diode pillar is also a function of alignment between features 638 and 738 (e.g., conductivity may be significantly diminished where features 638 and 738 are misaligned). Accordingly, having the ability to check alignment as described herein is an important part of producing memory cells that perform in a desirable and/or predictable manner. Nevertheless, alignment is important to more than just memory cells.

Figure 18:
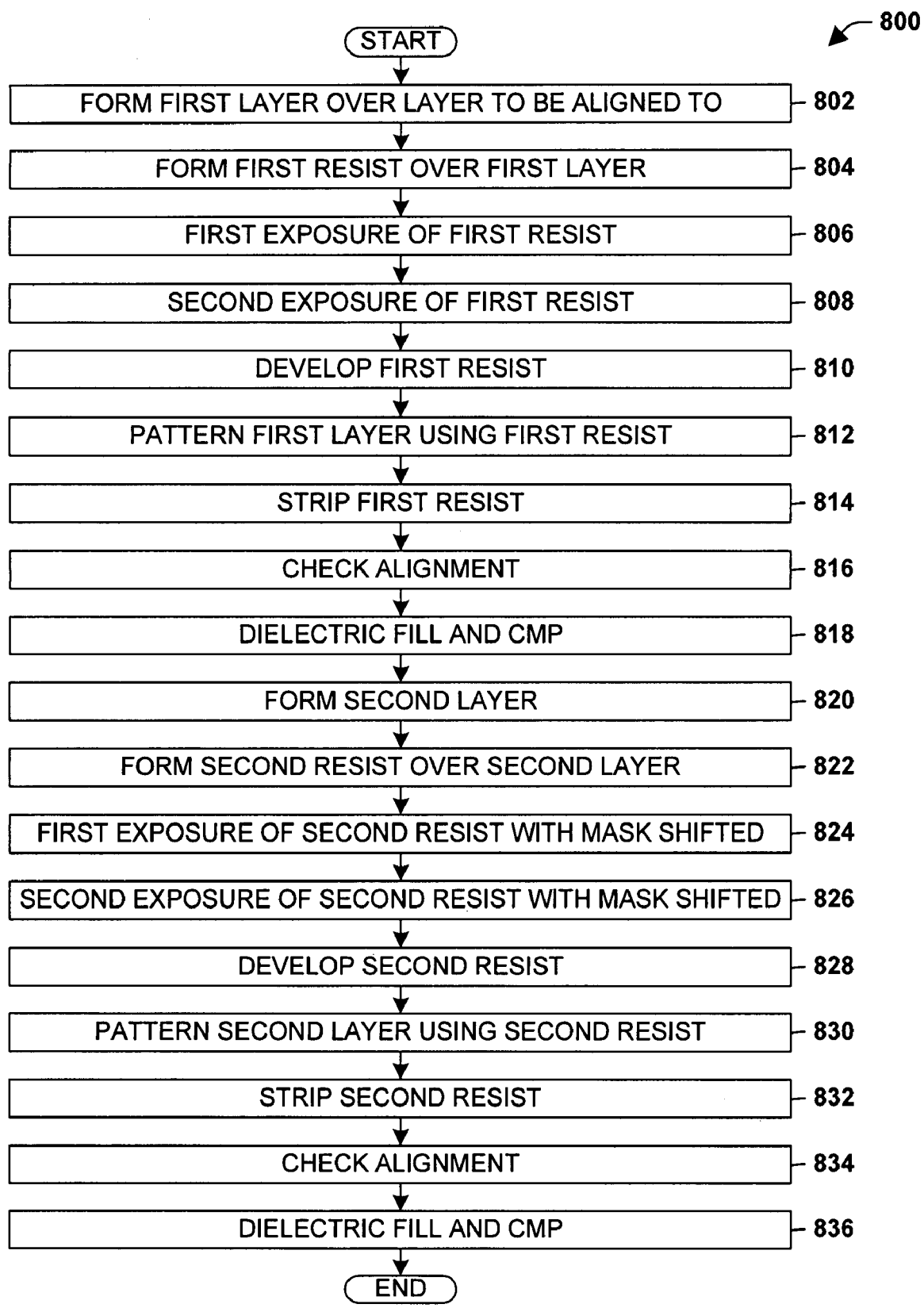
FIG. 18 illustrates a methodology for reusing the same mask to pattern multiple layers while mitigating alignment/interference issues.
Figure 19:
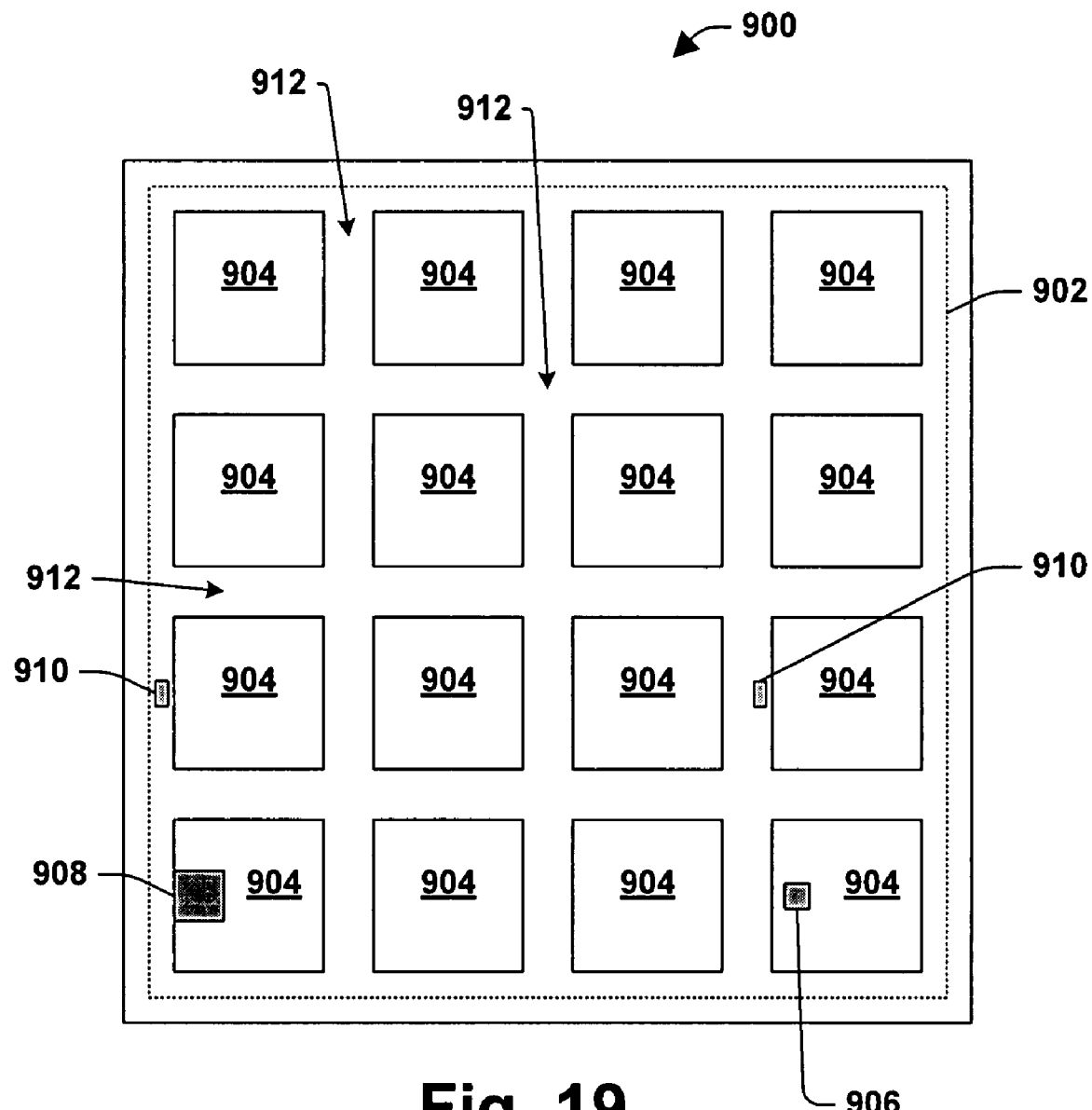
FIG. 19 illustrates a mask that can be used to pattern multiple layers while mitigating alignment/interference issues.

FIG. 18 illustrates another example methodology 800 for reusing a mask to form coincident patterns in multiple layers while mitigating alignment/interference issues, and an example semiconductor substrate 1000 where-over such a methodology is implemented is generally illustrated in FIGS. 20-31. An example mask 900 that can be used to facilitate the methodology 800 is illustrated in FIG. 19. The mask 900 is similar to mask 500 and thus similar aspects, operations and/or features are not detailed again. Mask 900 differs from mask 500, however, in that it has no openings 516 (FIG. 5) outside of the exposure area 902. Additionally, the mask 900 comprises an area 908 that facilitates forming a target overlay mark in an underlaying area, and this area 908, as well as measured overlay generating area 906, is formed in squares 904 corresponding to die. Also, test structure generating areas 910 are formed in areas 912 corresponding to scribe lines.

At 802, a first layer 1004 is formed over a layer 1000 to be aligned to (and thus which has one or more target overlay marks 1002 formed therein) (FIGS. 20-22). In one example, the first layer 1004 comprises a semiconductor material, such as polysilicon and is formed to a thickness of between about 100 nanometers and about 400 nanometers, for example. A first resist 1006 is formed over the first layer 1004 at 804 (FIGS. 20-22), and is exposed for a first time at 806 (FIGS. 20-22). In this manner, areas 1010, 1012, and 1014 are "formed" in the first resist 1006 (FIGS. 20-22). The mask 900 is then fully shifted (e.g., four die columns) and the first resist 1006 is exposed through the mask 900 a second time at 808 (FIGS. 23-25). In this manner, additional areas 1010, 1012, and 1014 are "formed" in the first resist 1006 (FIGS. 23-25).

Figure 24A:
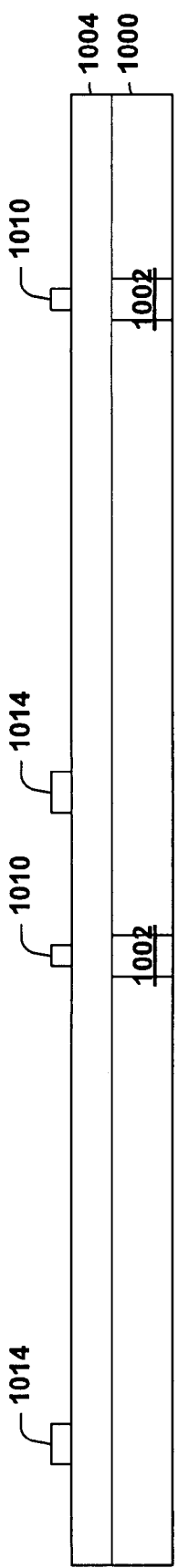
FIG. 24a illustrates a cross sectional view of the arrangement of FIG. 23 taken along lines 24-24 after the first resist is developed.
Figure 25A:
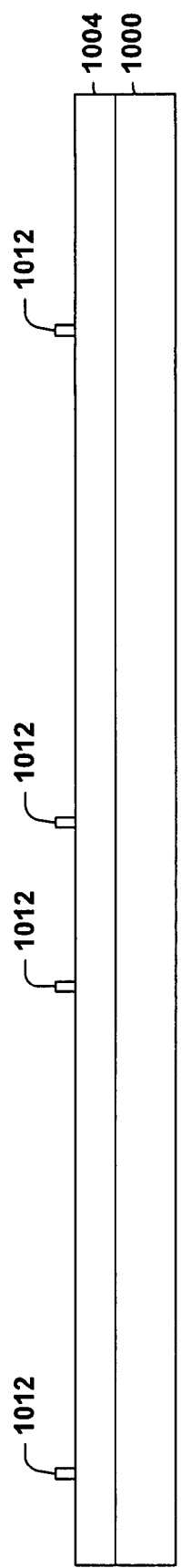
FIG. 25a illustrates a cross sectional view of the arrangement of FIG. 23 taken along lines 25-25 after the first resist is developed.
Figure 24B:
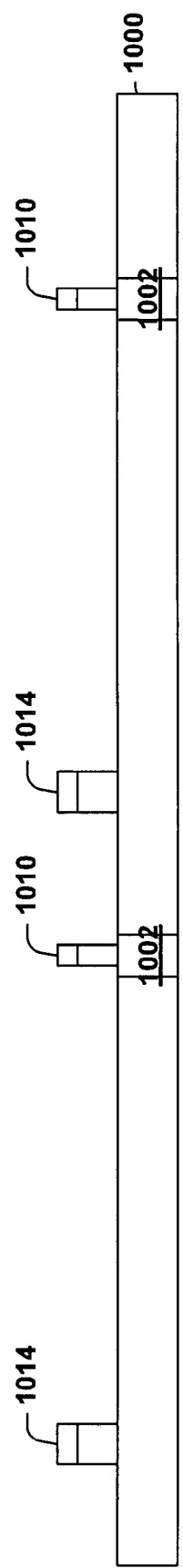
FIG. 24b illustrates a cross sectional view of the arrangement of FIG. 23 taken along lines 24-24 after a first layer is patterned.
Figure 25B:
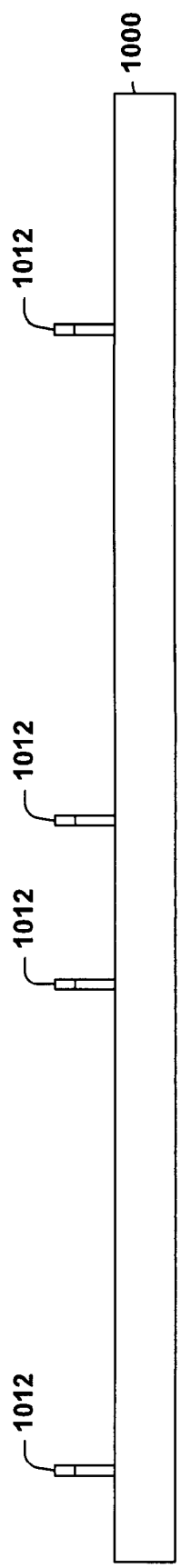
FIG. 25b illustrates a cross sectional view of the arrangement of FIG. 23 taken along lines 25-25 after the first layer is patterned.

The first resist 1006 is developed at 810 so that merely portions 1010, 1012, and 1014 of the first resist 1006 that were protected by the mask 900 remain (the many other remaining portions (over die) are not shown) (FIGS. 24*a*, 25*a*). At 812, the patterned first resist 1006 is used to pattern (e.g., via etching) the first layer 1004 (FIGS. 24*b*, 25*b*). The patterned first resist 1006 is then removed (e.g., chemically stripped) at 814 to reveal measured overlay marks 1036, target overlay marks 1037 and test structures 1038 formed from the first layer 1006 (FIGS. 24*c*, 25*c*). Alignment can then be checked at 816 by comparing (the degree of coincidence between) the measured overlay marks 1036 in the first layer 1006 to the target overlay marks 1002 in the underlying layer 1000 (FIG. 24*c*). As discussed above with regard to 418 and/or 434, alignment can also be checked just after the first resist 1006 is developed. Areas between the measured overlay marks 1036, the target overlay marks 1037, the test structures 1038 and other patterned features (not shown) in the first layer 1004 are then filled in with a dielectric or nonconductive material 1040, such as silicon dioxide, for example, including optionally planarizing via CMP, at 818 (FIGS. 24*d*, 25*d*).

Figure 29:
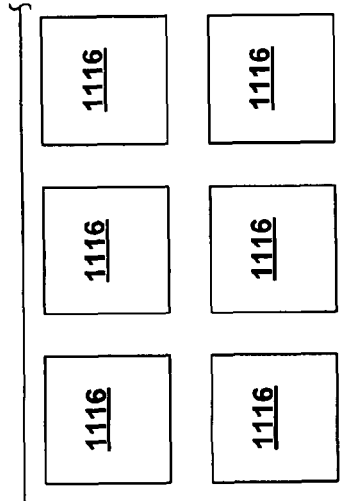
FIG. 29 illustrates a top view of a semiconductor arrangement after the second resist is exposed for a second time.
Figure 30:
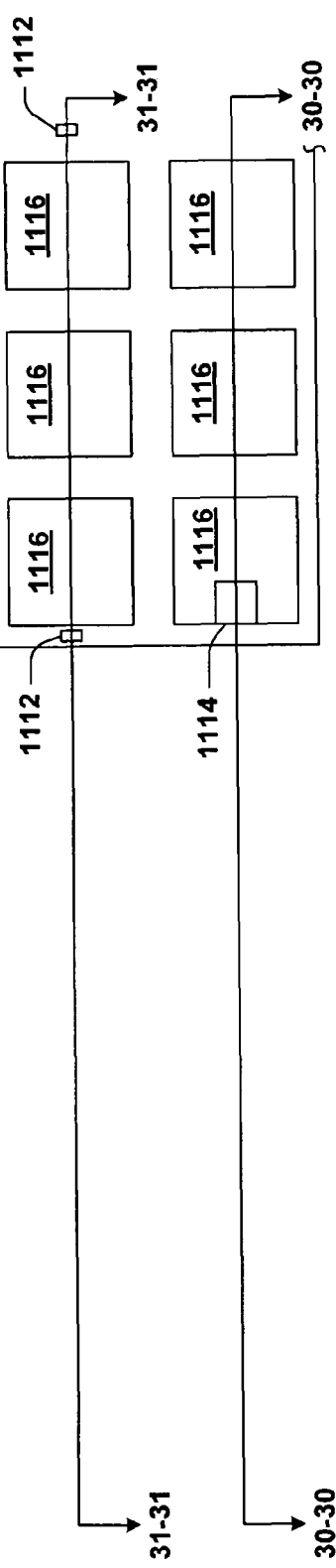
FIG. 30 illustrates a cross sectional view of the arrangement of FIG. 29 taken along lines 30-30.
Figure 31:
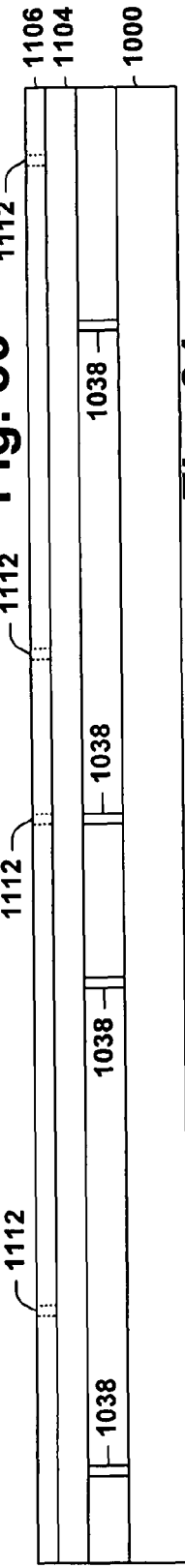
FIG. 31 illustrates a cross sectional view of the arrangement of FIG. 29 taken along lines 31-31.

At 820, a second layer 1104 is formed, and a second resist 1106 is formed over the second layer 1104 at 822 (FIGS. 26-28). The second layer 1104 may comprise metal oxide, for example, and may be formed to a thickness of between about 1 nanometer and about 10 nanometers, for example. The second resist 1106 is exposed for a first time at 824 with the mask 900 shifted one space (e.g., one die column) (FIGS. 26-28). In this manner, areas 1110, 1112, and 1114 are "formed" in the second resist 1106. At 826, the second resist 1106 is exposed for a second time with the mask 900 fully shifted (e.g., four die columns) (FIGS. 29-31). In this manner, additional areas 1110, 1112, and 1114 are "formed" in the second resist 1106.

Figure 30A:
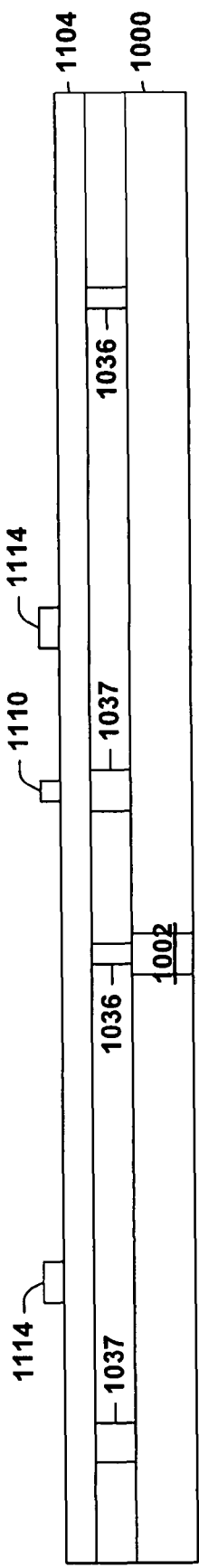
FIG. 30a illustrates a cross sectional view of the arrangement of FIG. 29 taken along lines 30-30 after the first resist is developed.
Figure 31A:
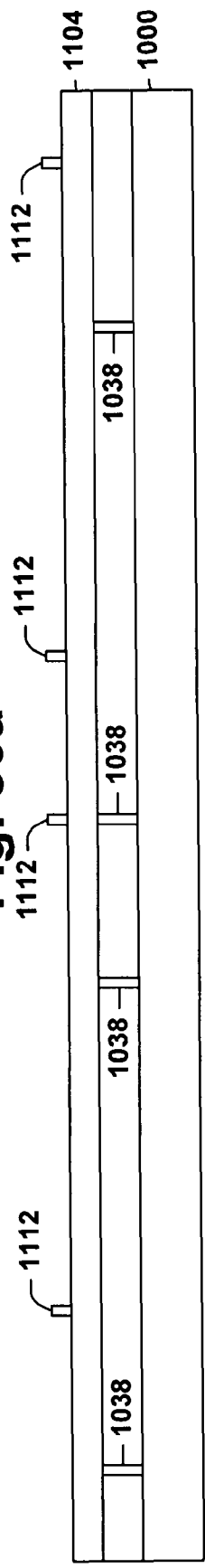
FIG. 31a illustrates a cross sectional view of the arrangement of FIG. 29 taken along lines 31-31 after the first resist is developed.
Figure 30B:
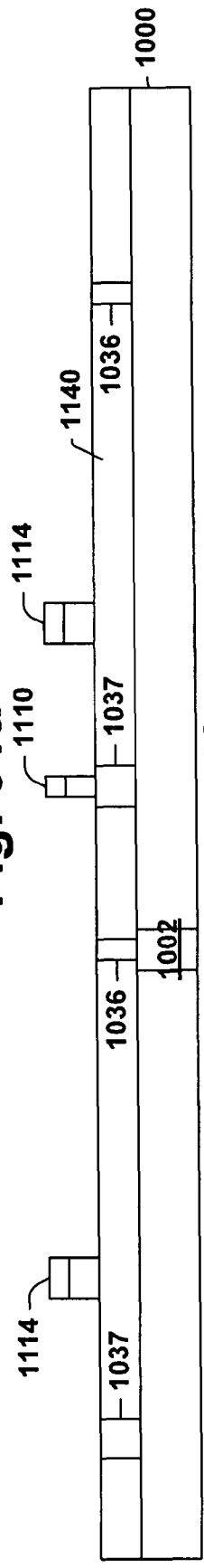
FIG. 30b illustrates a cross sectional view of the arrangement of FIG. 29 taken along lines 30-30 after a first layer is patterned.
Figure 31B:
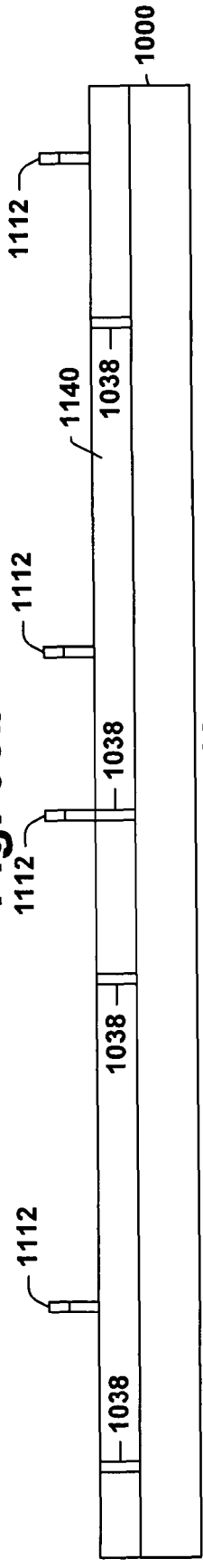
FIG. 31b illustrates a cross sectional view of the arrangement of FIG. 29 taken along lines 31-31 after the first layer is patterned.

The second resist 1106 is developed at 828 so that merely portions 1110, 1112, and 1114 of the second resist 1106 will remain (the many other remaining portions (over die) are not shown) (FIGS. 30*a*, 31*a*). At 830, the patterned second resist 1106 is used to pattern the second layer 1104 (e.g., via etching) (FIGS. 30*b*, 31*b*). The patterned second resist 1106 is then removed (e.g., chemically stripped) at 832 to reveal measured overlay marks 1136, target overlay marks 1137 and test structures 1138 formed from the second layer 1104 (FIGS. 30*c*, 31*c*). Alignment can then be checked at 834 by comparing (the degree of coincidence between) the measured overlay mark 1136 formed from the second layer 1104 to the target overlay mark 1037 previously formed from the first layer 1004 (FIG. 30*c*). As discussed above with regard to 418, 434 and/or 816, alignment can also be checked just after the second resist 1106 is developed. Areas between the measured overlay marks 1136, the target overlay marks 1137, the test structures 1138 and other patterned features (not shown) formed from the second layer 1104 are then filled with a dielectric material 1140, such as silicon dioxide, for example, including optionally planarizing via CMP, at 836 (FIGS. 30*d*, 31*d*).

It will be appreciated that the arrangement of having a measured overlay mark (e.g., mark 1136 formed in the second layer 1104) be formed over a target overlay mark (e.g., mark 1137 formed in the first layer 1004) will be repeated when the mask is used in this manner (e.g., shifted by one die column when used to treat a subsequent layer). Nevertheless, it is also to be appreciated that the mask can be shifted any number of columns to achieve this effect depending upon the configuration of the mask. For example, if target overlay mark generating area 908 and measured overlay mark generating area 906 were spaced apart by a different number of die columns, then the mask would be shifted by a corresponding number of die columns before treating a subsequent layer to achieve this effect.

Additionally, it can be seen that different types of test structures that comprise different features and/or combinations of features are formed in this method. For example, some test structures 1150 comprise the test structure features 1038, 1138 from both the first 1004 and second 1104 layers, while other test structures 1152 and 1154, respectively, comprise the test structure features 1038 from the first layer 1004 or the test structure features 1138 from the second layer 1104 (FIG. 31*d*). Test structure 1150 can be said to comprise a first instance of 1038 and a first instance of 1138, where the first instance of 1138 is above and aligned with the first instance of 1038. Test structure 1152 can be said to comprise a second instance of 1038 that is not aligned with any instance of 1138, and test structure 1154 can be said to comprise a second instance of 1138 that is not aligned with any instance of 1038.

It can be appreciated that different test structures can provide valuable information about the fabrication process and the devices formed therein. For example, if the devices formed comprise memory cells as discussed above with regard to 638, 738 and FIG. 17*d*, it may be desirable to monitor and/or compare the respective conductivities of the different test structures 1150, 1152 and 1154 to determine, among other things, the respective effects that the features 1038 and 1138 have on the overall conductivity of the cells 1150.

It will also be appreciated that while the first 604, 1004 and second 704, 1104 layers are illustrated and described as being in contact with one another, that there may be intervening layers between these layers, but that the first 604, 1004 and second 704, 1104 layers can still be aligned to one another. For example, silicon dioxide, which is often used as a filler in intervening layers is substantially transparent and thus allows underlaying reference marks to remain visible from above. Further, the disclosure is not meant to be limited by the particular numbers and/or arrangements of the reference marks and/or test structures described herein (e.g., more or fewer reference marks and/or test structures at the same or different locations can be implemented in accordance with the present disclosure).

The use of a mask as disclosed herein may be suitable for fabricating, among other things, a monolithic three dimensional memory array in which multiple memory levels are formed above a single substrate, such as a wafer, with no intervening substrates. Respective memory levels generally comprise a plurality of memory cells as discussed above with regard to FIG. 17*d* and FIG. 31*d*, where the cells are separated from one another by a dielectric material. The layers forming one memory level are deposited or grown directly over the layers of an existing level or levels. In contrast, stacked memories are constructed by forming memory levels on separate substrates and adhering the memory levels atop each other. The substrates may be thinned or removed from the memory levels before bonding, but as the memory levels are initially formed over separate substrates, such memories are not true monolithic three dimensional memory arrays.

It will be appreciated that while reference is made throughout this document to exemplary structures in discussing aspects of methodologies described herein (e.g., those structures presented in FIGS. 6-17 while discussing the methodology set forth in FIG. 4, and those structures presented in FIGS. 20-31 while discussing the methodology set forth in FIG. 18), that those methodologies are not to be limited by the corresponding structures. Rather, the methodologies (and structures) are to be considered independent of one another and able to stand alone. Also, equivalent alterations and/or modifications may occur to those skilled in the art based upon a reading and/or understanding of the specification and annexed drawings. The disclosure herein is intended to include all such modifications and alterations and is generally not intended to be limited thereby. In addition, while a particular feature and/or aspect may have been disclosed with respect to only one or more of several implementations, such feature and/or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated.

What is claimed is:

1. A method of reusing a mask in semiconductor processing, comprising:
   using the mask to form on a first layer a first pattern and a first reference mark coincident with a reference mark in a first underlaying layer that lies under the first layer; and
   using the mask to form on a second layer that is over the first layer a second pattern aligned with the first pattern and a second reference mark coincident with a reference mark in a second underlaying layer that lies under the second layer and the second reference mark not aligned with the first reference mark, without the use of an intervening blocking structure in the first layer, the first underlaying layer, the second layer or the second underlaying layer.

2. The method of claim 1, the first and second underlaying layers corresponding to the same layer.

3. The method of claim 1, the second underlaying layer corresponding to the first layer.

4. The method of claim 3, comprising:
   using the mask to form the second reference mark in the first layer while forming the first pattern and the first reference mark.

5. The method of claim 1, comprising:
   shifting the mask relative to the second layer in forming the second reference mark.

6. A method of reusing a mask in semiconductor processing, comprising:
   using the mask to form a first pattern and two or more first reference marks in a first resist overlying a first layer, the two or more first reference marks coincident with corresponding reference marks in a first underlaying layer that lies under the first layer;
   using the mask to remove at least one, but less than all, of the first reference marks from the first resist;
   transferring the first pattern and the remaining first reference marks to the first layer;
   using the mask to form a second pattern and at least one second reference mark in a second resist formed over a second layer formed over the patterned first layer, the at least one second reference mark aligned with a location where a first reference mark was removed from the first resist and coincident with a corresponding reference mark in a second underlaying layer that lies under the second layer; and
   transferring the second pattern and the at least one second reference mark to the second layer.

7. The method of claim 6, the first and second underlaying layers corresponding to the same layer.

8. The method of claim 6, removing one, but less than all, of the first reference marks from the first resist comprising:
   shifting the mask in a first direction such that at least one of the first reference marks to be removed is no longer protected by the mask; and
   exposing the at least one of the first reference marks to be removed.

9. The method of claim 8, removing one, but less than all, of the first reference marks from the first resist comprising:
   covering first reference marks that are not to be removed before exposing the at least one of the first reference marks to be removed.

10. The method of claim 9, removing one, but less than all, of the reference marks from the first resist comprising:
    covering first reference marks that are not to be removed with a shutter after the mask is shifted in the first direction.

11. The method of claim 8, removing one, but less than all, of the first reference marks from the first resist comprising:
    shifting the mask in a second direction such that at least one additional first reference mark to be removed is no longer protected by the mask; and
    exposing the at least one additional first reference mark to be removed.

12. The method of claim 11, removing one, but less than all, of the first reference marks from the first resist comprising:
    covering first reference marks that are not to be removed before exposing the at least one additional first reference mark to be removed.

13. The method of claim 12, removing one, but less than all, of the first reference marks from the first resist comprising:
    covering first reference marks that are not to be removed with a shutter after the mask is shifted in the second direction.

14. The method of claim 11, the second direction opposite the first direction.

15. A method of reusing a mask in semiconductor processing, comprising:
    using the mask to form a first pattern, a first target overlay mark and a first measured overlay mark coincident with a corresponding target overlay mark in an underlaying layer in a first layer; and
    using the mask to form a second pattern aligned with the first pattern and a second measured overlay mark coincident with the first target overlay mark in a second layer overlaying the first layer.

16. The method of claim 15, comprising:
    shifting the mask before forming the second pattern and the second measured overlay mark.

17. The method of claim 16, comprising:
    using the mask to form a second target overlay mark in the second layer coincident with a subsequently formed measured overlay mark formed in a subsequent layer.

18. The method of claim 17, comprising:
using the mask to form the first pattern, the first target overlay mark and the first measured overlay mark in a first resist overlying the first layer;
transferring the first pattern, the first target overlay mark and the first measured overlay mark to the first layer;
using the mask to form the second pattern, the second measured overlay mark and the second target overlay mark in a second resist overlaying the second layer; and
transferring the second pattern, the second measured overlay mark and the second target overlay mark to the second layer.

* * * * *